(12) United States Patent
Sirinorakul et al.

(10) Patent No.: US 10,734,247 B2
(45) Date of Patent: Aug. 4, 2020

(54) SEMICONDUCTOR PACKAGE WITH MULTIPLE MOLDING ROUTING LAYERS AND A METHOD OF MANUFACTURING THE SAME

(71) Applicant: UTAC Headquarters PTE. LTD., Singapore (SG)

(72) Inventors: Saravuth Sirinorakul, Bangkok (TH); Suebphong Yenrudee, Bangkok (TH)

(73) Assignee: UTAC Headquarters PTE. LTD, Singapore (SG)

( * ) Notice: Subject to any disclaimer, the term of this patent is extended or adjusted under 35 U.S.C. 154(b) by 98 days.

(21) Appl. No.: 15/803,605

(22) Filed: Nov. 3, 2017

(65) Prior Publication Data

US 2018/0061667 A1     Mar. 1, 2018

Related U.S. Application Data

(62) Division of application No. 15/347,695, filed on Nov. 9, 2016, now Pat. No. 10,032,645.
(Continued)

(51) Int. Cl.
*H01L 21/48*     (2006.01)
*H01L 23/495*    (2006.01)
(Continued)

(52) U.S. Cl.
CPC ........ *H01L 21/4825* (2013.01); *H01L 21/481* (2013.01); *H01L 21/486* (2013.01); *H01L 21/4828* (2013.01); *H01L 21/4842* (2013.01); *H01L 21/4857* (2013.01); *H01L 21/4867* (2013.01); *H01L 21/561* (2013.01); *H01L 21/565* (2013.01); *H01L 21/78* (2013.01); *H01L 23/3114* (2013.01); *H01L 23/4952* (2013.01); *H01L 23/49503* (2013.01); *H01L 23/49527* (2013.01); *H01L 23/49534* (2013.01); *H01L 23/49548* (2013.01); *H01L 23/49558* (2013.01); *H01L 23/49582* (2013.01); *H01L 23/49586* (2013.01); *H01L 23/49805* (2013.01);
(Continued)

(58) Field of Classification Search
None
See application file for complete search history.

(56) References Cited

U.S. PATENT DOCUMENTS 3,611,061 A   10/1971   Segerson
4,411,719 A   10/1983   Lindberg
(Continued)

OTHER PUBLICATIONS

Michael Quirk and Julian Serda, Semiconductor Manufacturing Technology, Pearson Education International, Pearson Prentice Hall, 2001, 4 pages.

(Continued)

*Primary Examiner* — Marcos D. Pizarro
*Assistant Examiner* — Quinton A Brasfield
(74) *Attorney, Agent, or Firm* — Haverstock & Owens LLP

(57) ABSTRACT

Embodiments of the present invention are directed to a method of manufacturing a semiconductor package with an internal routing circuit. The internal routing circuit is formed from multiple molding routing layers in a leadframe land grid array semiconductor package by using a laser to blast away un-designed conductive areas to create conductive paths on each molding compound layer of the semiconductor package.

17 Claims, 30 Drawing Sheets

Related U.S. Application Data

(60) Provisional application No. 62/253,601, filed on Nov. 10, 2015.

(51) Int. Cl.
  *H01L 23/31* (2006.01)
  *H01L 21/56* (2006.01)
  *H01L 21/78* (2006.01)
  *H01L 23/00* (2006.01)
  *H01L 23/498* (2006.01)

(52) U.S. Cl.
  CPC .............. *H01L 24/45* (2013.01); *H01L 24/48* (2013.01); *H01L 23/49524* (2013.01); *H01L 23/49541* (2013.01); *H01L 24/97* (2013.01); *H01L 2224/45139* (2013.01); *H01L 2224/45144* (2013.01); *H01L 2224/45147* (2013.01); *H01L 2224/45164* (2013.01); *H01L 2224/45565* (2013.01); *H01L 2224/45572* (2013.01); *H01L 2224/48091* (2013.01); *H01L 2224/48235* (2013.01); *H01L 2224/48247* (2013.01); *H01L 2924/00014* (2013.01)

(56) References Cited

U.S. PATENT DOCUMENTS

| | | |
|---|---|---|
| 4,501,960 A | 2/1985 | Jouvet et al. |
| 4,801,561 A | 1/1989 | Sankhagowit |
| 4,855,672 A | 8/1989 | Shreeve |
| 5,105,259 A | 4/1992 | McShane et al. |
| 5,195,023 A | 3/1993 | Manzione et al. |
| 5,247,248 A | 9/1993 | Fukunaga |
| 5,248,075 A | 9/1993 | Young et al. |
| 5,281,851 A | 1/1994 | Mills et al. |
| 5,396,185 A | 3/1995 | Honma et al. |
| 5,397,921 A | 3/1995 | Kamezos |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Kamezos |
| 5,959,363 A | 9/1999 | Yamada et al. |
| 5,976,912 A | 11/1999 | Fukutomi et al. |
| 5,990,692 A | 11/1999 | Jeong et al. |
| 6,033,933 A | 3/2000 | Hur |
| 6,072,239 A | 6/2000 | Yoneda et al. |
| 6,111,324 A | 8/2000 | Sheppard et al. |
| 6,159,770 A | 12/2000 | Tetaka et al. |
| 6,177,729 B1 | 1/2001 | Benenati et al. |
| 6,197,615 B1 | 3/2001 | Song et al. |
| 6,208,020 B1 | 3/2001 | Minamio et al. |
| 6,229,200 B1 | 5/2001 | Mclellan et al. |
| 6,242,281 B1 | 6/2001 | Mclellan et al. |
| 6,250,841 B1 | 6/2001 | Ledingham |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Kamezos et al. |
| 6,329,711 B1 | 12/2001 | Kawahara et al. |
| 6,353,263 B1 | 3/2002 | Dotta et al. |
| 6,372,625 B1 | 4/2002 | Shigeno et al. |
| 6,376,921 B1 | 4/2002 | Yoneda et al. |
| 6,384,472 B1 | 5/2002 | Huang |
| 6,392,427 B1 | 5/2002 | Yang |
| 6,414,385 B1 | 7/2002 | Huang et al. |
| 6,429,048 B1 | 8/2002 | McLellan et al. |
| 6,448,665 B1 | 9/2002 | Nakazawa |
| 6,451,709 B1 | 9/2002 | Hembree |
| 6,455,348 B1 | 9/2002 | Yamaguchi |
| 6,476,469 B2 | 11/2002 | Hung et al. |
| 6,489,218 B1 | 12/2002 | Kim et al. |
| 6,498,099 B1 | 12/2002 | McLellan et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,667,191 B1 | 12/2003 | McLellan et al. |
| 6,683,368 B1 | 1/2004 | Mostafazadeh |
| 6,686,667 B2 | 2/2004 | Chen et al. |
| 6,703,696 B2 | 3/2004 | Ikenaga et al. |
| 6,723,585 B1 | 4/2004 | Tu et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,750,546 B1 | 6/2004 | Villanueva et al. |
| 6,764,880 B2 | 7/2004 | Wu et al. |
| 6,781,242 B1 | 8/2004 | Fan et al. |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,894,376 B1 | 5/2005 | Mostafazadeh et al. |
| 6,897,428 B2 | 5/2005 | Minamio et al. |
| 6,927,483 B1 | 8/2005 | Lee et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 1/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,041,533 B1 | 5/2006 | Akram et al. |
| 7,045,883 B1 | 5/2006 | McCann et al. |
| 7,049,177 B1 | 5/2006 | Fan et al. |
| 7,052,935 B2 | 5/2006 | Pai et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,126,218 B1 | 10/2006 | Darveaux et al. |
| 7,205,178 B2 | 4/2007 | Shiu et al. |
| 7,224,048 B1 | 5/2007 | McLellan et al. |
| 7,247,526 B1 | 7/2007 | Fan et al. |
| 7,253,503 B1 | 8/2007 | Fusaro et al. |
| 7,259,678 B2 | 8/2007 | Brown et al. |
| 7,268,415 B2 | 9/2007 | Abbott et al. |
| 7,274,088 B2 | 9/2007 | Wu et al. |
| 7,314,820 B2 | 1/2008 | Lin et al. |
| 7,315,077 B2 | 1/2008 | Choi et al. |
| 7,315,080 B1 | 1/2008 | Fan et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,459,345 B2 | 12/2008 | Hwan |
| 7,476,975 B2 | 1/2009 | Ogata |
| 7,482,690 B1 | 1/2009 | Fan et al. |
| 7,495,319 B2 | 2/2009 | Fukuda et al. |
| 7,595,225 B1 | 9/2009 | Fan et al. |

(56) References Cited

U.S. PATENT DOCUMENTS

| | | |
|---|---|---|
| 7,608,484 B2 | 10/2009 | Lange et al. |
| 7,709,857 B2 | 5/2010 | Kim et al. |
| 7,714,418 B2 * | 5/2010 | Lim .................. H01L 21/568 |
| | | 257/666 |
| 8,084,299 B2 | 12/2011 | Tan |
| 8,710,651 B2 | 4/2014 | Sakata et al. |
| 9,006,034 B1 | 4/2015 | Sirinorakul |
| 2001/0005047 A1 | 6/2001 | Jimarez et al. |
| 2001/0007285 A1 | 7/2001 | Yamada et al. |
| 2001/0008305 A1 | 7/2001 | McLellan |
| 2002/0090162 A1 | 7/2002 | Asada et al. |
| 2002/0109214 A1 | 8/2002 | Minamio et al. |
| 2002/0125550 A1 * | 9/2002 | Estacio ............ H01L 23/49562 |
| | | 257/666 |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0102540 A1 | 6/2003 | Lee |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2003/0234454 A1 | 12/2003 | Pedron et al. |
| 2004/0014257 A1 | 1/2004 | Kim et al. |
| 2004/0026773 A1 | 2/2004 | Koon et al. |
| 2004/0046237 A1 | 3/2004 | Abe et al. |
| 2004/0046241 A1 | 3/2004 | Combs et al. |
| 2004/0070055 A1 | 4/2004 | Punzalan et al. |
| 2004/0080025 A1 | 4/2004 | Kasahara et al. |
| 2004/0110319 A1 | 6/2004 | Fukutomi et al. |
| 2005/0003586 A1 | 1/2005 | Shimanuki et al. |
| 2005/0077613 A1 | 4/2005 | McLellan et al. |
| 2005/0184404 A1 | 8/2005 | Huang |
| 2005/0236701 A1 | 10/2005 | Minamio et al. |
| 2005/0263864 A1 | 12/2005 | Islam et al. |
| 2006/0019481 A1 | 1/2006 | Liu et al. |
| 2006/0071351 A1 | 4/2006 | Lange |
| 2006/0170081 A1 | 8/2006 | Gerber et al. |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0237231 A1 | 10/2006 | Hata et al. |
| 2006/0273433 A1 | 12/2006 | Itou et al. |
| 2007/0001278 A1 | 1/2007 | Jeon et al. |
| 2007/0013038 A1 | 1/2007 | Yang |
| 2007/0029540 A1 | 2/2007 | Kajiwara et al. |
| 2007/0093000 A1 | 4/2007 | Shim et al. |
| 2007/0200210 A1 | 8/2007 | Zhao |
| 2007/0235217 A1 | 10/2007 | Workman |
| 2008/0048308 A1 | 2/2008 | Lam |
| 2008/0150094 A1 | 6/2008 | Anderson |
| 2008/0251913 A1 | 10/2008 | Inomata |
| 2008/0293232 A1 | 11/2008 | Kang et al. |
| 2009/0014848 A1 | 1/2009 | Ong Wai Lian et al. |
| 2009/0152691 A1 | 6/2009 | Nguyen et al. |
| 2009/0152694 A1 | 6/2009 | Bemmert et al. |
| 2009/0230525 A1 | 9/2009 | Chang Chien et al. |
| 2009/0236713 A1 | 9/2009 | Xu et al. |
| 2009/0321778 A1 | 12/2009 | Chen et al. |
| 2010/0133565 A1 | 6/2010 | Cho et al. |
| 2010/0149773 A1 | 6/2010 | Said |
| 2010/0178734 A1 | 7/2010 | Lin |
| 2010/0224971 A1 | 9/2010 | Li |
| 2010/0327432 A1 | 12/2010 | Sirinorakul |
| 2011/0115061 A1 | 5/2011 | Krishnan et al. |
| 2011/0201159 A1 | 8/2011 | Mori et al. |
| 2012/0146199 A1 | 6/2012 | McMillan et al. |
| 2012/0178214 A1 | 7/2012 | Lam |
| 2012/0295484 A1 * | 11/2012 | Sato .................. H01R 13/22 |
| | | 439/626 |
| 2013/0069221 A1 | 3/2013 | Lee et al. |
| 2016/0174374 A1 * | 6/2016 | Kong ................ H05K 1/0245 |
| | | 174/262 |

OTHER PUBLICATIONS

Office Action dated Sep. 16, 2013, U.S. Appl. No. 13/689,531, filed Nov. 29, 2012, Saravuth Sirinorakul et al., 24 pages.

Office Action dated Dec. 20, 2013, U.S. No. 13/689,531, filed Nov. 29, 2012, Saravuth Sirinorakul et al., 13 pages.

Office Action dated Nov. 2, 2015, U.S. Appl. No. 12/834,688, filed Jul. 12, 2010, Saravuth Sirinorakul, 17 pages.

Notice of Allowance dated Feb. 27, 2015, U.S. Appl. No. 13/689,566, filed Nov. 29, 2012, Saravuth Sirinorakul, 8 pages.

Office Action from the U.S. Patent Office, U.S. Appl. No. 12/002,054, filed Dec. 14, 2007, First Named Inventor: Somchai Nondhashitthichai, dated Aug. 19, 2015, 17 pages.

Notice of Allowance from the U.S. Patent Office, U.S. Appl. No. 12/378,119, filed Feb. 10, 2009, First Named Inventor: Somchai Nondhasitthichai, dated Jul. 23, 2015, 7 pages.

Office Action dated Dec. 19, 2012, U.S. Appl. No. 12/834,688, filed Jul. 12, 2010, Saravuth Sirinorakul, 26 pages.

Non-Final Office Action dated Feb. 4, 2019, U.S. Appl. No. 14/571,036, filed Dec. 15, 2014, Applicant: Saravuth Sirinorakul, 16 pages.

* cited by examiner

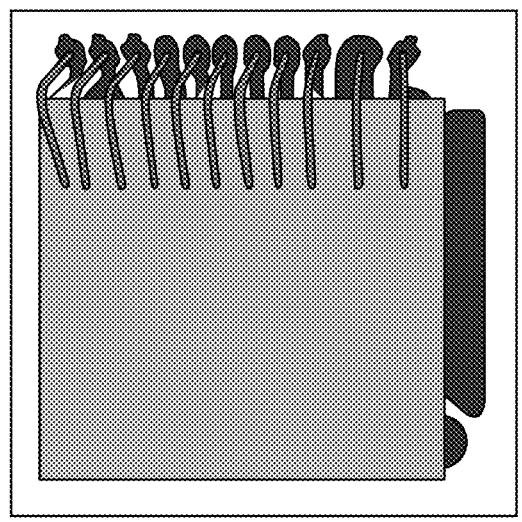
Top View: Die with wire bonding
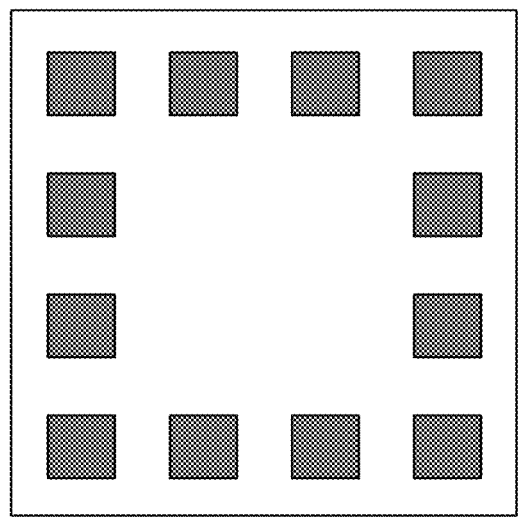
Bottom View: Package terminal
Fig. 1A
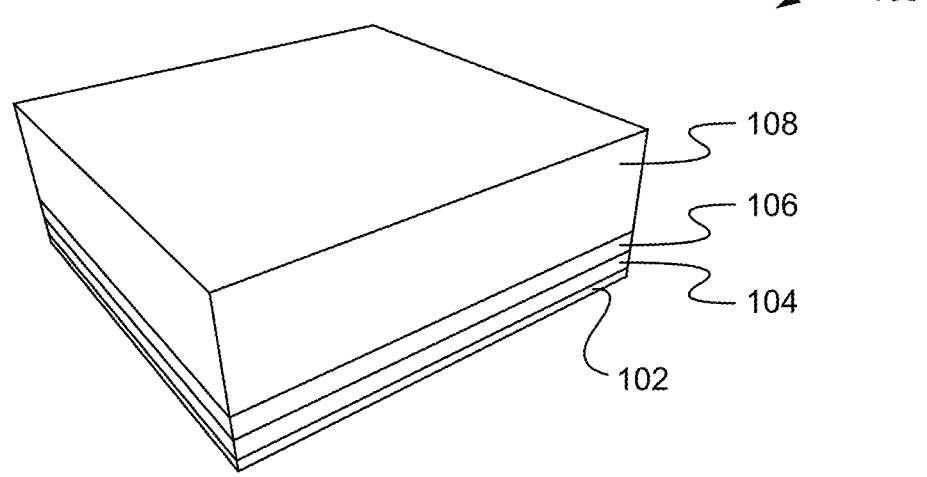
Fig. 1B

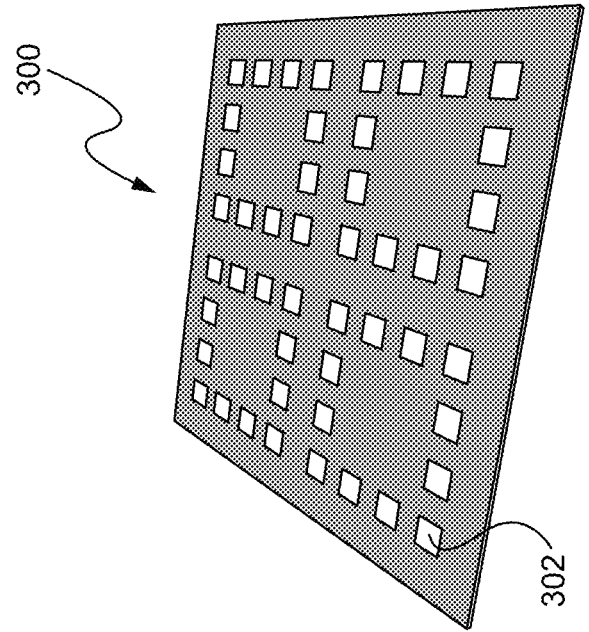
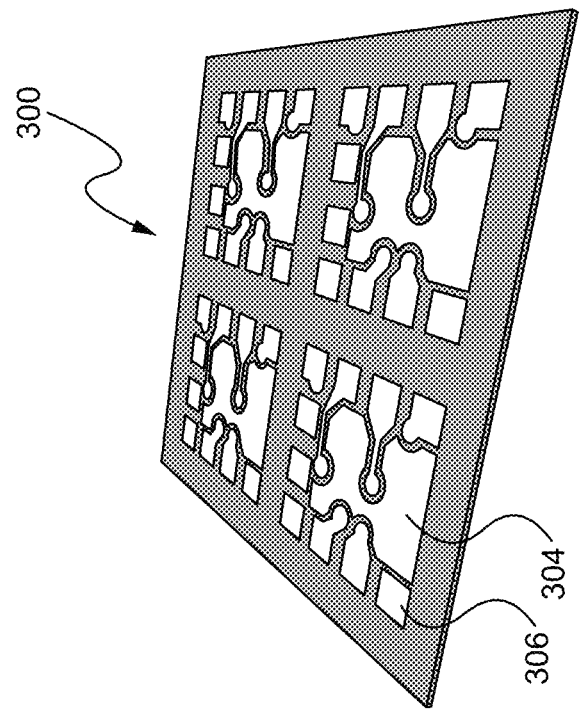
Fig. 3A

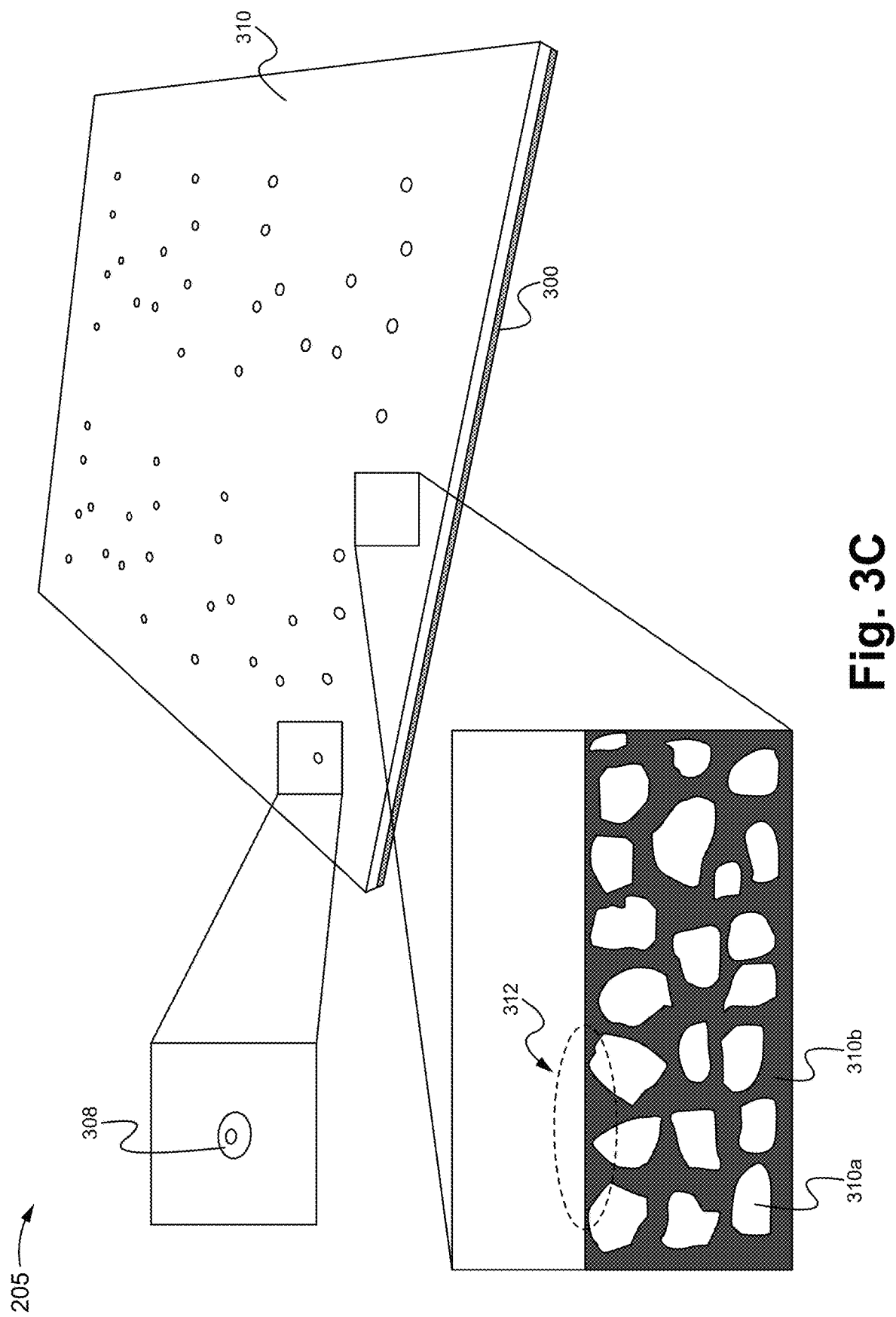

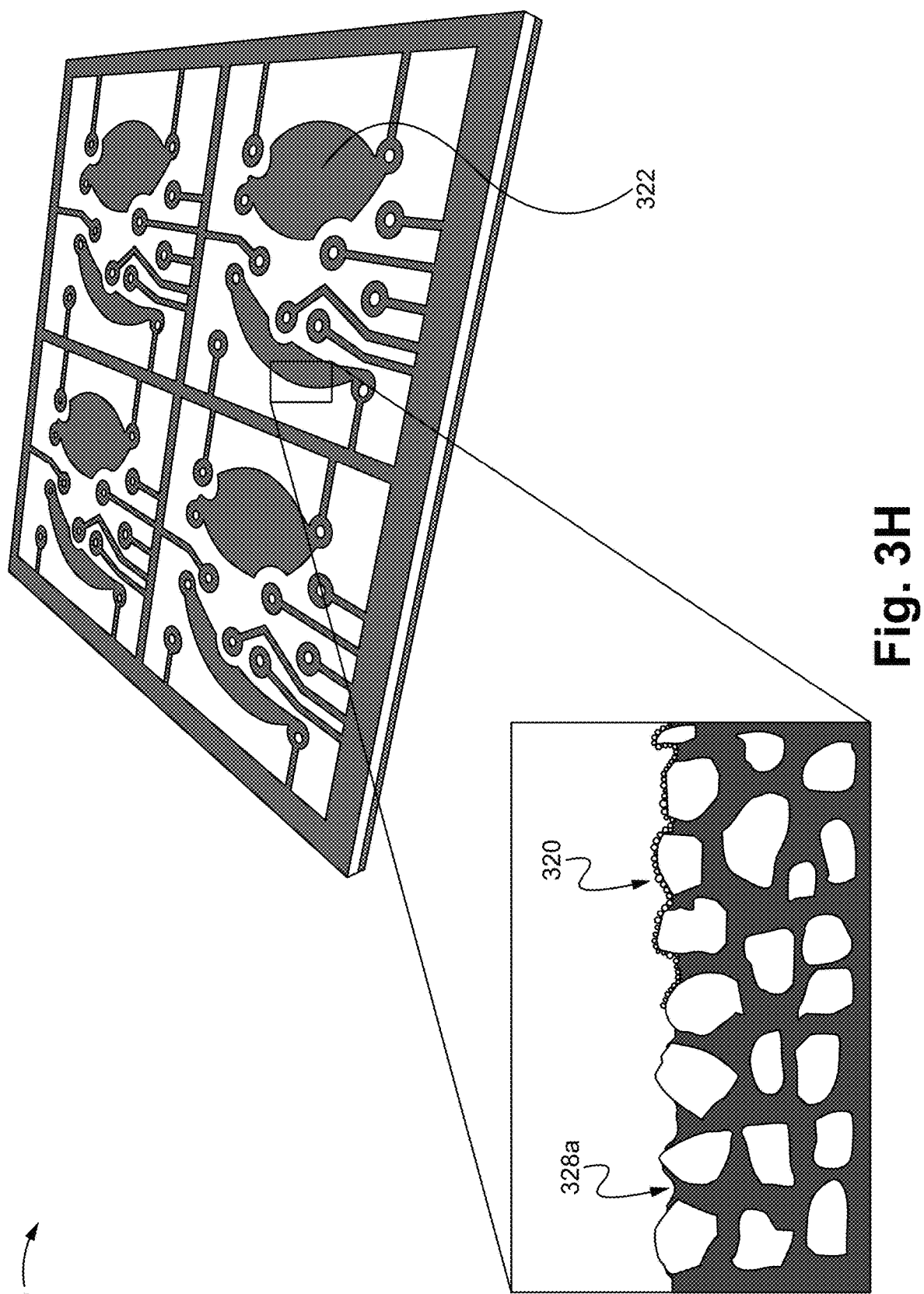

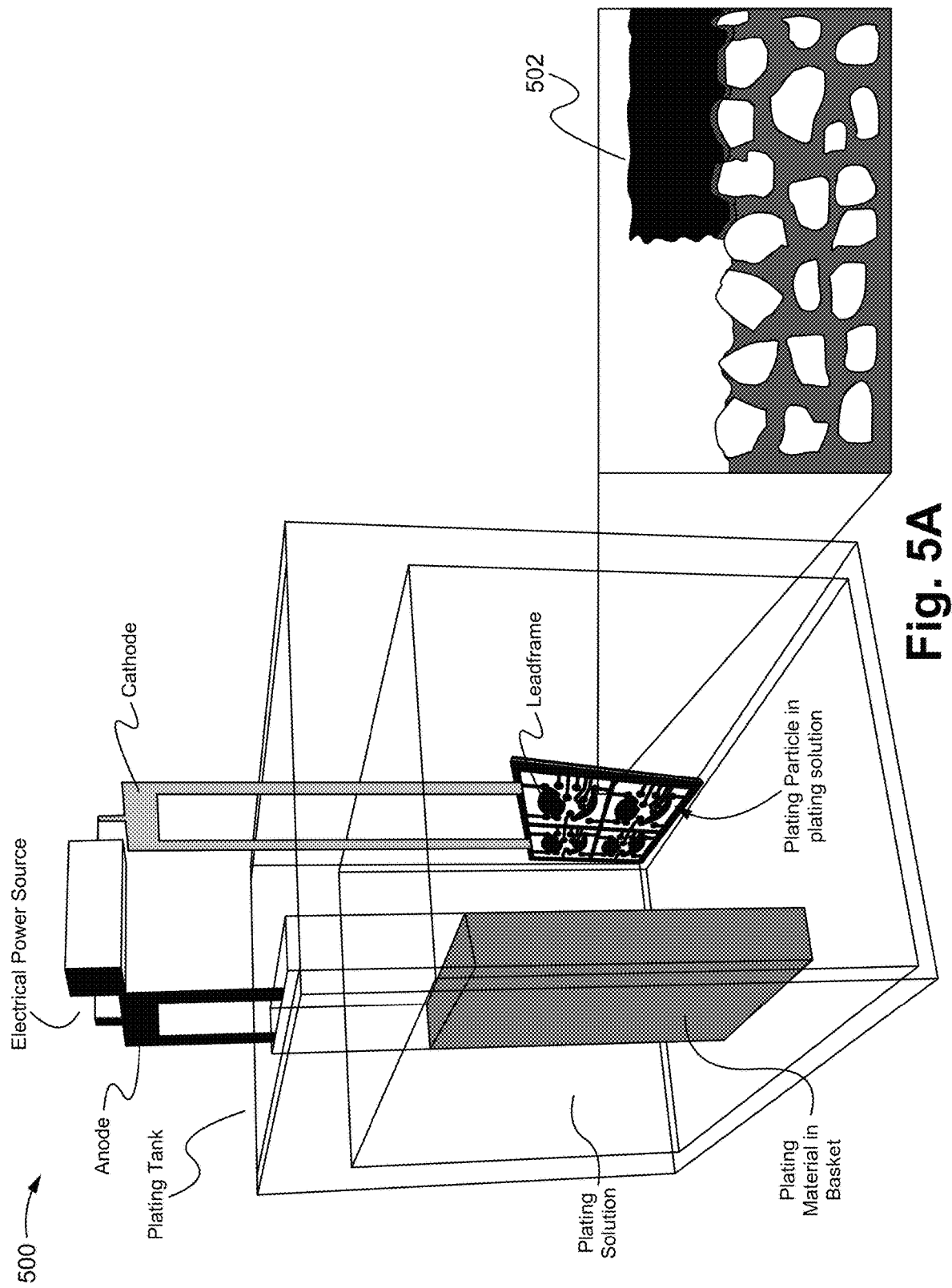

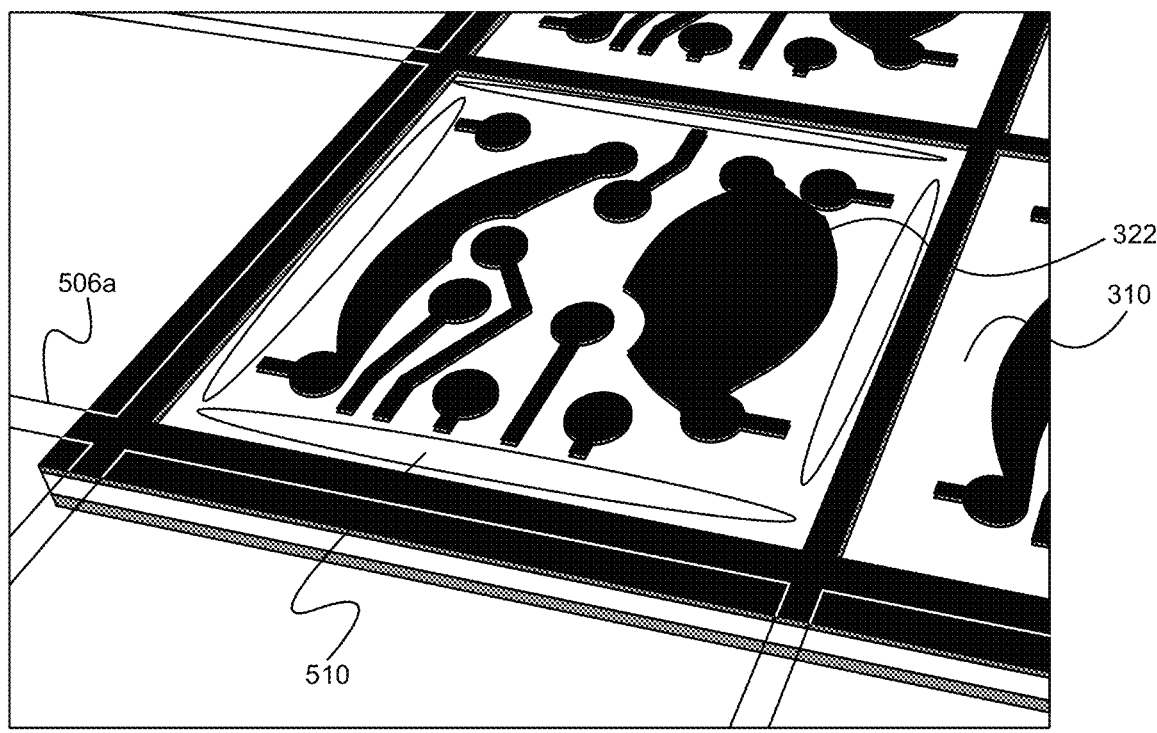
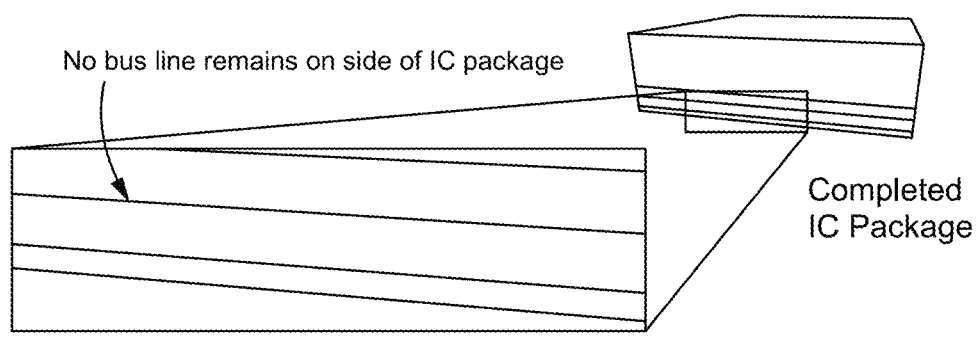
Fig. 5D

SEMICONDUCTOR PACKAGE WITH MULTIPLE MOLDING ROUTING LAYERS AND A METHOD OF MANUFACTURING THE SAME

RELATED APPLICATIONS

This application is a divisional application which claims priority under 35 U.S.C. 121 of the U.S. patent application Ser. No. 15/347,695, filed Nov. 9, 2016, entitled "A Semiconductor Package with Multiple Molding Routing Layers and a Method of Manufacturing the Same," which in turn claims benefit of priority under 35 U.S.C. section 119(e) of the U.S. Provisional Patent Application Ser. No. 62/253,601, filed Nov. 10, 2015, entitled "Semiconductor Package with Multi Molding Routing Layers," which are hereby incorporated by reference in their entirety.

FIELD OF INVENTION

The present invention is related to the field of semiconductor package manufacturing. More specifically, the present invention relates to a semiconductor package with an internal routing circuit formed from multiple molding routing layers in the package.

BACKGROUND OF THE INVENTION

There is a growing demand for high-performance semiconductor packages. However, increases in semiconductor circuit density pose interconnect challenges for a packaged chip's thermal, mechanical and electrical integrity. Thus, there is a need for a method of manufacturing a semiconductor package with improved routing capabilities.

BRIEF SUMMARY OF THE INVENTION

Embodiments of the present invention are directed to a method of manufacturing a semiconductor package with an internal routing circuit. The internal routing circuit is formed from multiple molding routing layers in a leadframe land grid array semiconductor package by using a laser to blast away un-designed conductive areas to create conductive paths on each molding compound layer of the semiconductor package.

In one aspect, a semiconductor package is provided. The semiconductor package includes package terminals, and a base metal plated routing layer that includes base metal routing circuits. The base metal routing circuits are formed on a first side of a copper leadframe, and the package terminals are formed on a second side of the leadframe.

The semiconductor package also includes at least one additional metal plated routing layer. Each of the at least one additional metal plated routing layer includes a plurality of interconnections coupled with routing circuits associated with a previous routing layer that is directly beneath the current metal plated routing layer, and an intermediary insulation layer formed on top of the previous routing layer. The plurality of interconnections protrudes from a top surface of the intermediary insulation layer that has an unnatural surface roughness that is rougher than the natural surface roughness of the intermediary insulation layer. Molding compound of the intermediary insulation layer surrounds the routing circuits associated with the previous routing layer. Each of the at least one additional metal plated routing layer also includes additional metal routing circuits adhered on the unnaturally roughened top surface of the intermediary insulation layer. The additional metal routing circuits includes a plurality of metal plated layers.

In some embodiments, the routing circuits associated with each routing layer is structured differently from the routing circuits associated with other routing layers. In some embodiments, the additional metal routing circuits associated with each of the at least one additional metal plated routing layer is structured differently from the additional metal routing circuits associated with other additional metal plated routing layers.

In some embodiments, each of the at least one additional metal plated routing layer further includes bus lines extending from the additional metal routing circuits. The bus lines are not exposed at sides of the semiconductor package, although the bus lines can be exposed at the sides of the semiconductor package.

The semiconductor package includes an internal routing circuit from die terminals on the die to the package terminals. The internal routing circuit is formed by all the routing layers in the semiconductor package. The semiconductor package also includes a die coupled with a topmost metal plated routing layer, a topmost insulation layer encapsulating the die and the topmost metal routing layer, and a bottommost insulation layer encapsulating the base metal routing circuits.

In another aspect, a method of manufacturing semiconductor devices that includes a plurality of conductive routing layers is provided. The method includes obtaining a plated leadframe that includes a plurality of base metal routing circuits and a plurality of package terminals, wherein the plurality of base metal routing circuits forms a base metal plated routing layer. In some embodiments, obtaining a plated leadframe includes plating a plurality of areas on surfaces of a copper substrate, thereby resulting in the plated leadframe. The plurality of areas includes bottom plated areas that eventually form the plurality of package terminals and includes top plated areas that form the plurality of base metal routing circuits.

The method also includes forming at least one additional metal plated routing layer on top of the base metal plated routing layer. Each of the at least one additional metal plated routing layer is formed by coupling a plurality of interconnections with routing circuits associated with a previous routing layer that is directly beneath the current metal plated routing layer being formed, forming an intermediary insulation layer on top of the previous routing layer, wherein the plurality of interconnections protrudes from a top surface of the intermediary insulation layer that has the natural surface roughness, performing an abrasion procedure to roughen at least the top surface of the intermediary insulation layer such that, after the abrasion procedure, the top surface of the intermediary insulation layer has an unnatural surface roughness that is rougher than the natural surface roughness, and adhering a metal layer on the roughened top surface of the intermediary insulation layer to form a plurality of additional metal routing circuits that is included in the current metal plated routing layer.

In some embodiments, the abrasion procedure includes coating at least the top surface of the intermediary insulation layer with an adhesion promoter material, heating the leadframe such that the adhesion promoter material reacts with a portion of the intermediary insulation layer, and etching away a baked film, resulting in the top surface of the intermediary insulation layer having the unnatural surface roughness that is rougher than the natural surface roughness.

In some embodiments, each of the at least one additional metal plated routing layer is further formed by, after performing an abrasion procedure and before adhering a metal layer on the roughened top surface, depositing a catalyst material on the roughened top surface of the intermediary insulation layer, and removing unwanted areas of the catalyst material such that the remaining areas of the catalyst material form a structure of the plurality of additional metal routing circuits.

In some embodiments, adhering a metal layer on the roughened top surface includes using a metal chemical solution, wherein metal substance in the metal chemical solution reacts with the remaining areas of the catalyst material such that the adhesion of the metal layer with the intermediary insulation layer having the unnatural surface roughness is better than the adhesion of the metal layer with the intermediary insulation layer having the natural surface roughness.

In some embodiments, each of the at least one additional metal plated routing layer is further formed by, after adhering a metal layer on the roughened top surface, obtaining a desired thickness of the additional metal routing circuits whereby metal is plated on metal. The desired thickness of the additional metal routing circuits can be obtained via an electroless plating process, wherein the electroless plating process includes repeating the depositing step, the removing step and the adhering step in one or more loops. Alternatively, the desired thickness of the additional metal routing circuits is obtained via an electrolytic plating process.

In some embodiments, each of the at least one additional metal plated routing layer is further formed by, after obtaining a desired thickness of the additional metal routing circuits, removing at least a portion of bus lines.

The method also includes coupling a plurality of dies with a topmost metal plated routing layer, encapsulating the plurality of dies and the topmost metal routing layer with a topmost insulation layer, etching away exposed copper at the bottom of the leadframe, thereby isolating the plurality of package terminals and exposing the plurality of base metal routing circuits at the bottom of the leadframe, encapsulating the plurality of exposed base metal routing circuits at the bottom of the leadframe with a bottommost insulation layer, and performing a cut-through procedure to singulate the semiconductor packages from each other.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1A illustrates an exemplary top view of a semiconductor die and an exemplary bottom view of a semiconductor package that shows package terminals.

FIG. 1B illustrates an exemplary external view of a final singulated semiconductor package in accordance with some embodiments.

FIG. 5A illustrates an exemplary electric plating machine.

FIG. 5B-FIG. 5D illustrate exemplary views of trimming bus lines in accordance to some embodiments.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

FIG. 1A illustrates an exemplary top view of a semiconductor die and an exemplary bottom view of a semiconductor package that includes exposed package terminals. Although FIG. 1A illustrates the semiconductor die being electrically coupled therein using wire bonds, it is contemplated that the semiconductor die can instead be electrically coupled using flip-chip bonds, such as solder bumps. Regardless of how the semiconductor die is coupled therein, an internal routing circuit of the semiconductor (IC) package provides for internal routing from die terminals of the semiconductor die to the package terminals of the semiconductor package.

Embodiments of the present invention are directed to a method of manufacturing a semiconductor package with an internal routing circuit. The internal routing circuit is formed from multiple molding routing layers in a leadframe land grid array semiconductor package by using a laser to blast away un-designed conductive areas to create conductive paths on each molding compound layer of the semiconductor package.

Figure 1C:
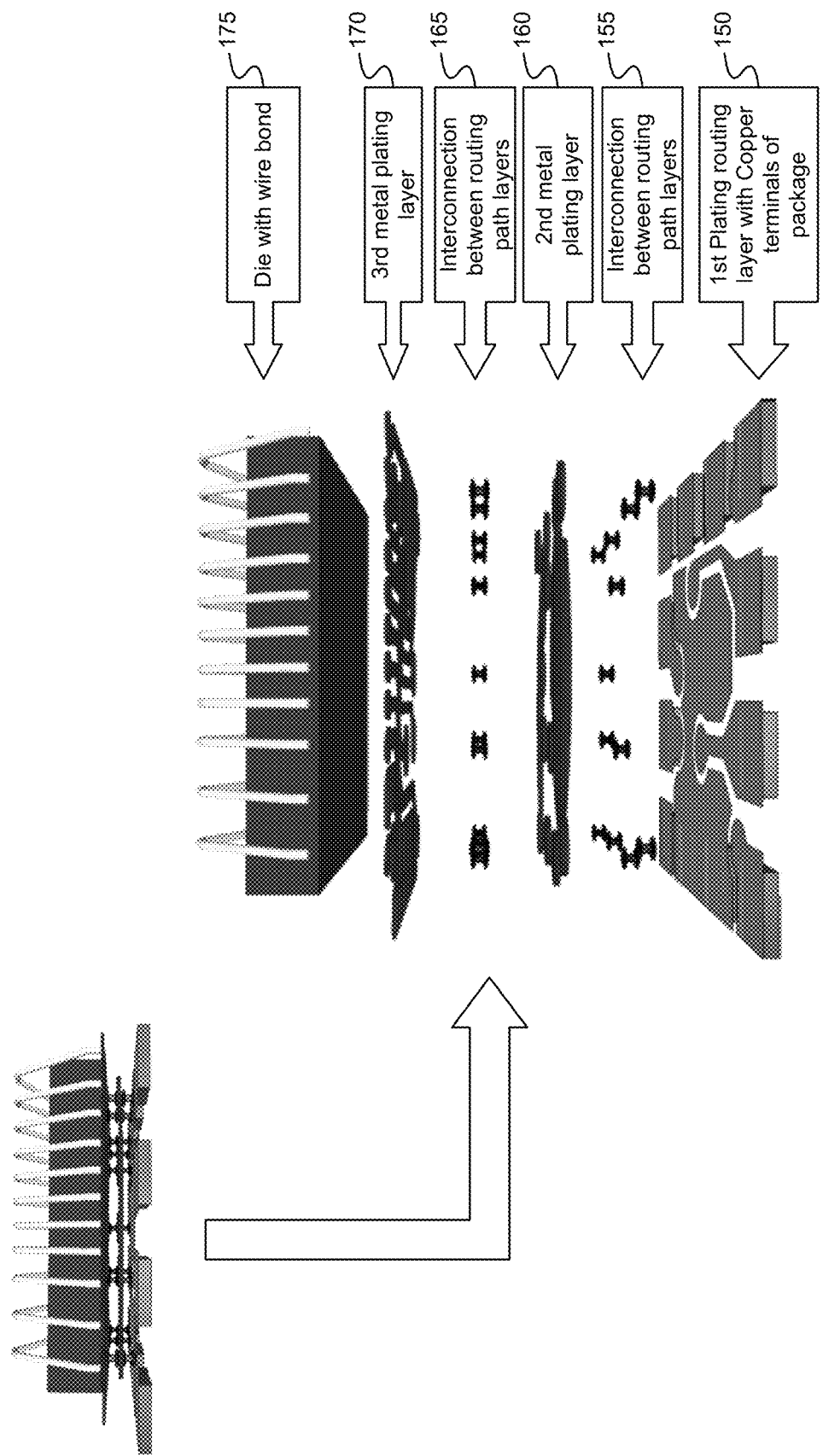
FIG. 1C illustrates an exemplary internal view of the semiconductor package of FIG. 1B in accordance with some embodiments.

FIG. 1B illustrates an exemplary external view of a final singulated semiconductor package 100 in accordance with some embodiments, while FIG. 1C illustrates an exemplary internal view of the semiconductor package 100, without molding compounds to show the structure of the internal routing circuit, in accordance with some embodiments. The internal routing circuit is formed from multiple molding routing path layers in the package 100.

The semiconductor package 100, as shown, includes three conductive routing path layers 150, 160, 170 electrically coupled via interconnections 155, 165 that are disposed between the routing path layers 150, 160, 170. The conductive routing path layers 150, 160, 170 form at least partially the internal routing circuit of the semiconductor package 100. However, it is noted that by the concepts discussed herein, more or less conductive routing layers can be formed within a semiconductor package. Typically, the topmost conductive routing path layer (e.g., conductive routing path layer 170 in FIG. 1C) is physically and electrically coupled with the semiconductor die 175, while the bottommost conductive routing path layer (e.g., conductive routing path layer 150 in FIG. 1C) is physically and electrically coupled with the package terminals. Each of the conductive routing path layers 150, 160, 170 and the semiconductor die 175 corresponds to a distinct and separate molding compound layer 102, 104, 106, 108. Generally, if there are N routing path layers, where N is an integer greater or equal to 1, then there are N+1 molding compound layers. In some embodiments, N is greater or equal to 2. In some embodiments, each layer of the molding compound 102-108 is visually indistinguishable from the other layers of the molding compound 102-108. Alternatively, each layer of the molding compounds 102-108 is visually distinguishable from the other layers of the molding compound 102-108.

In some embodiments, the bottommost conductive routing path layer is a metal plated routing layer, which is referred herein as a base metal plated routing layer, and each subsequent conductive routing path layer formed above the bottommost conductive routing path layer is also metal plated routing layer, which is referred herein as an additional metal plated routing layer.

Figure 2:
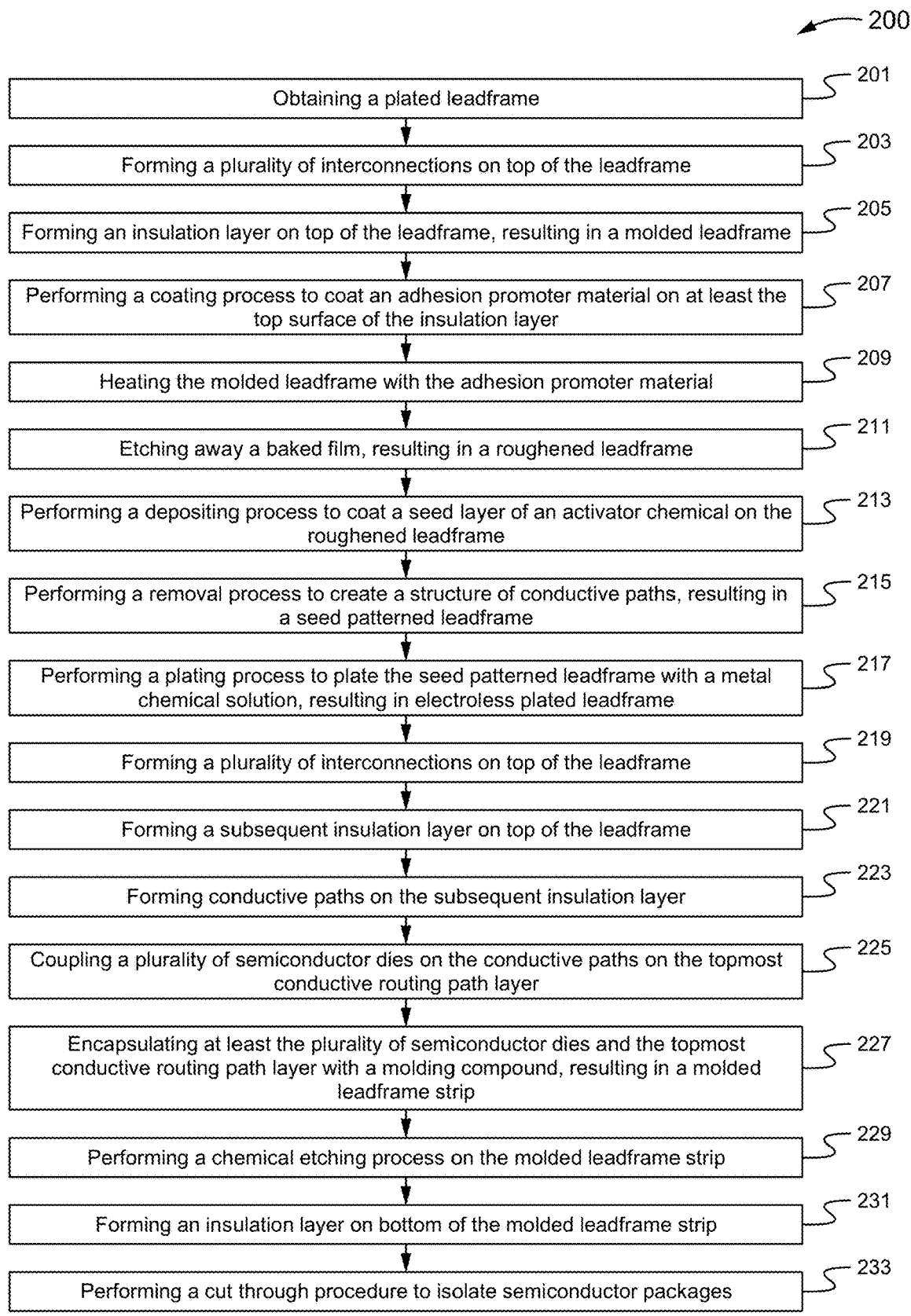
FIG. 2 illustrates an exemplary method of manufacturing a semiconductor package in accordance to some embodiments.
Figure 3B:
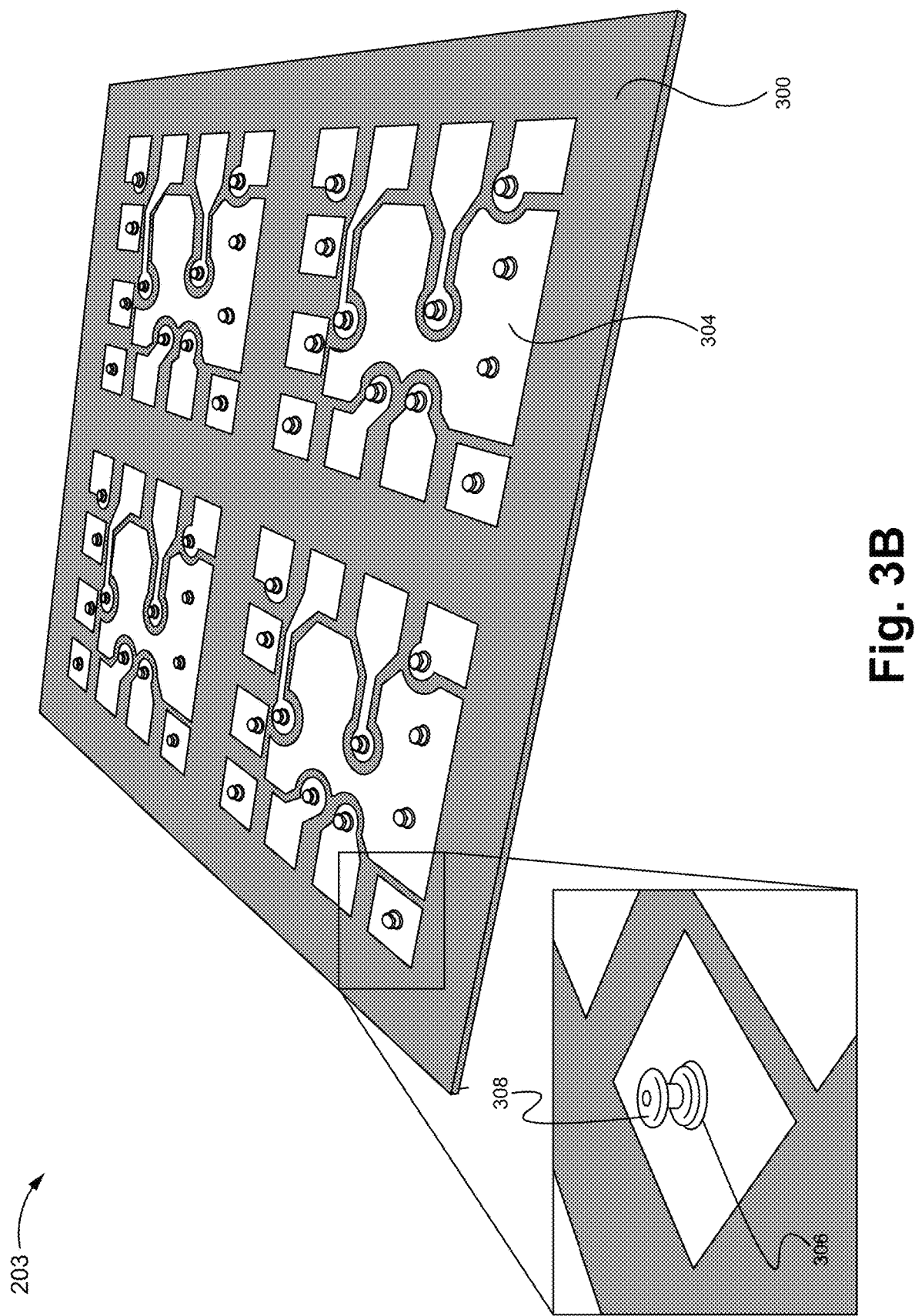
FIG. 3A-FIG. 3Q illustrate an exemplary result produced at each step of the method of FIG. 2.
Figure 3D:
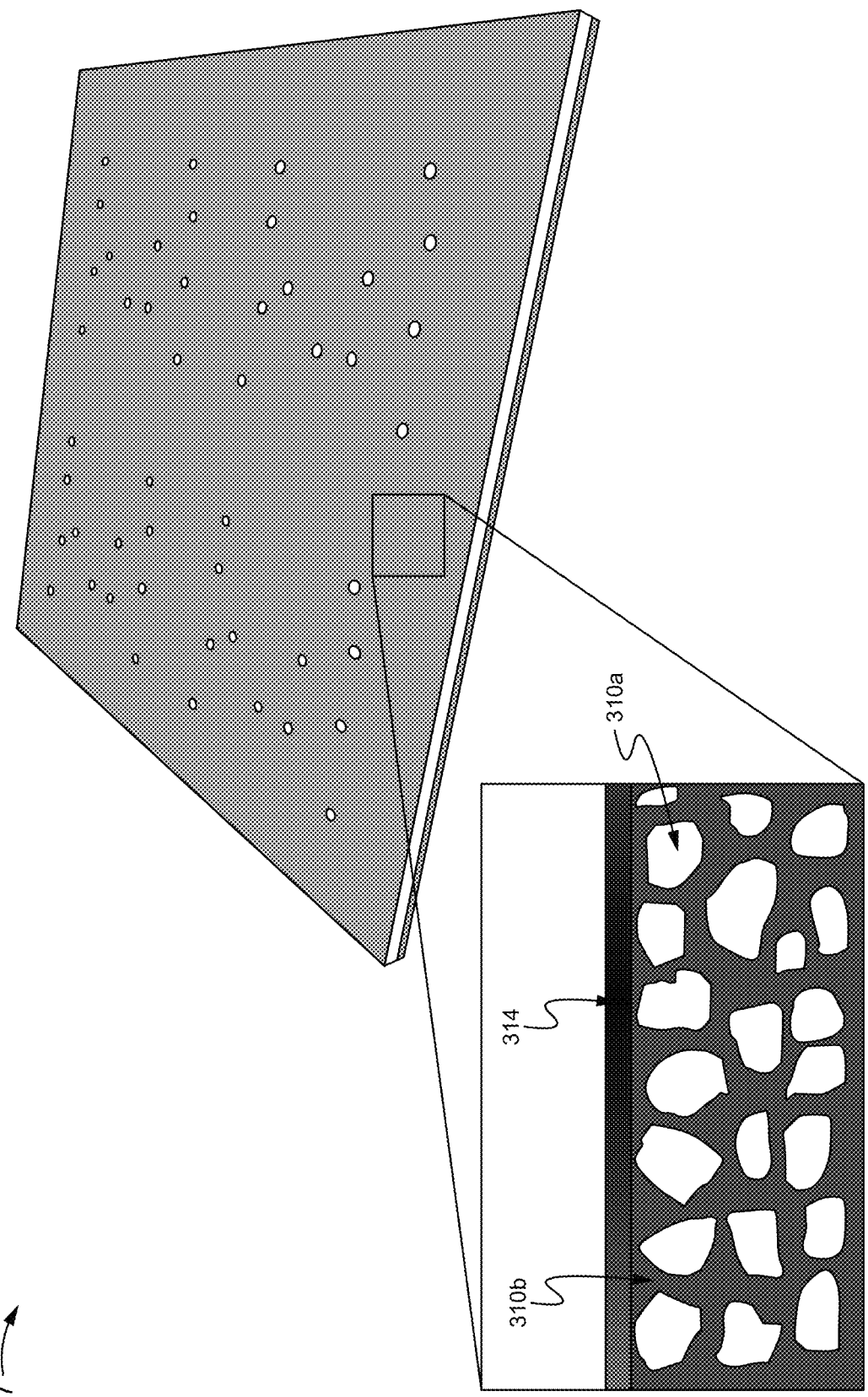
Figure 3E:
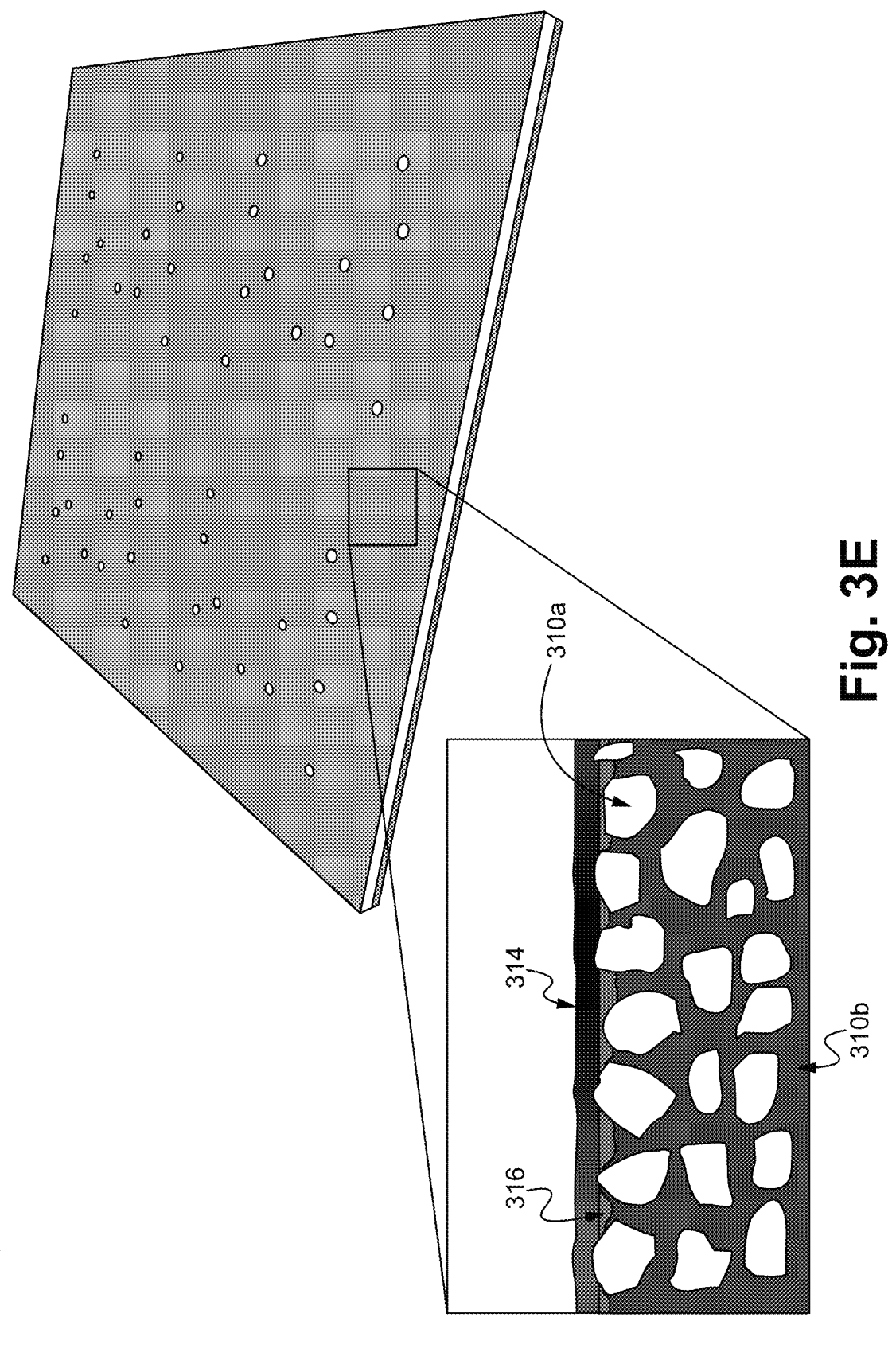
Figure 3F:
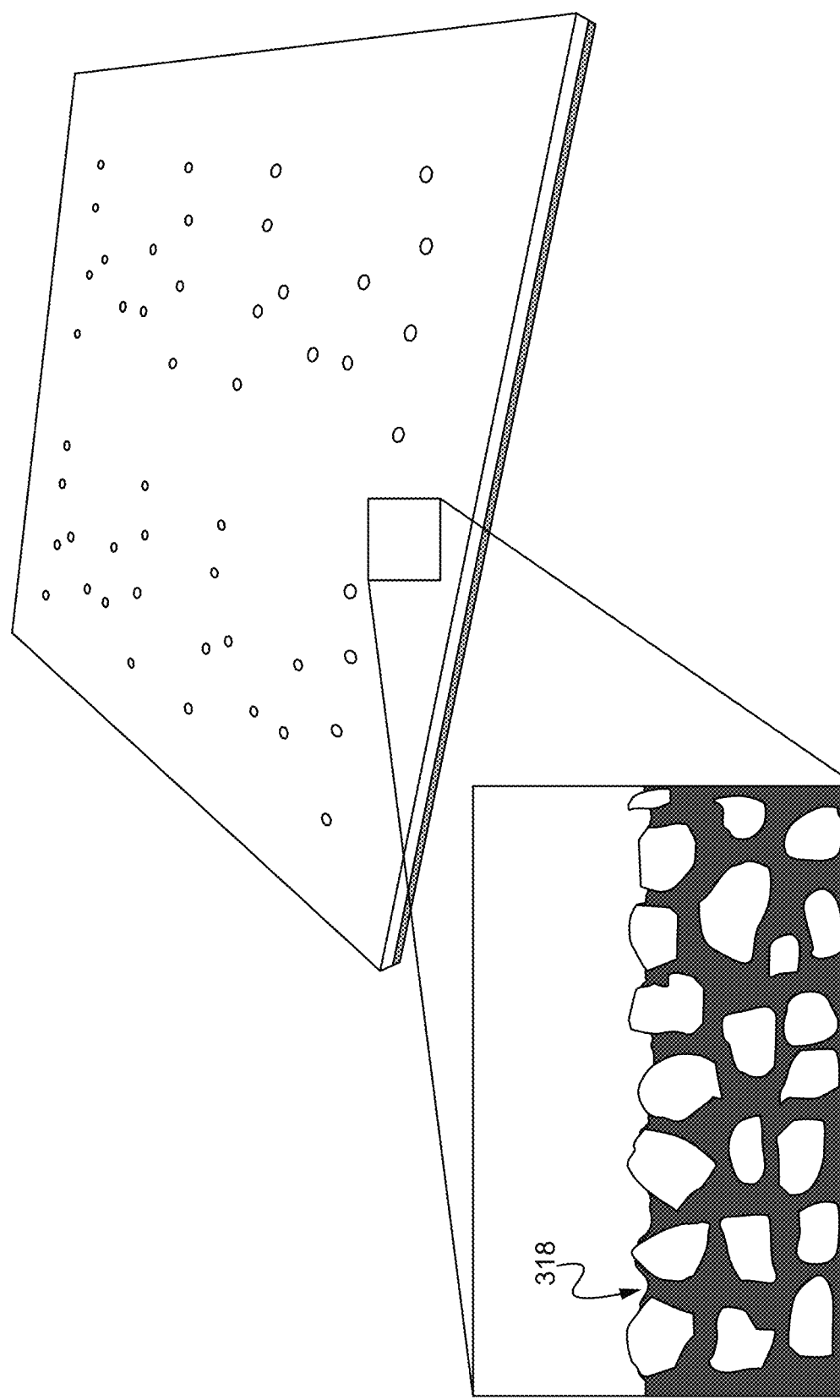
Figure 3G:
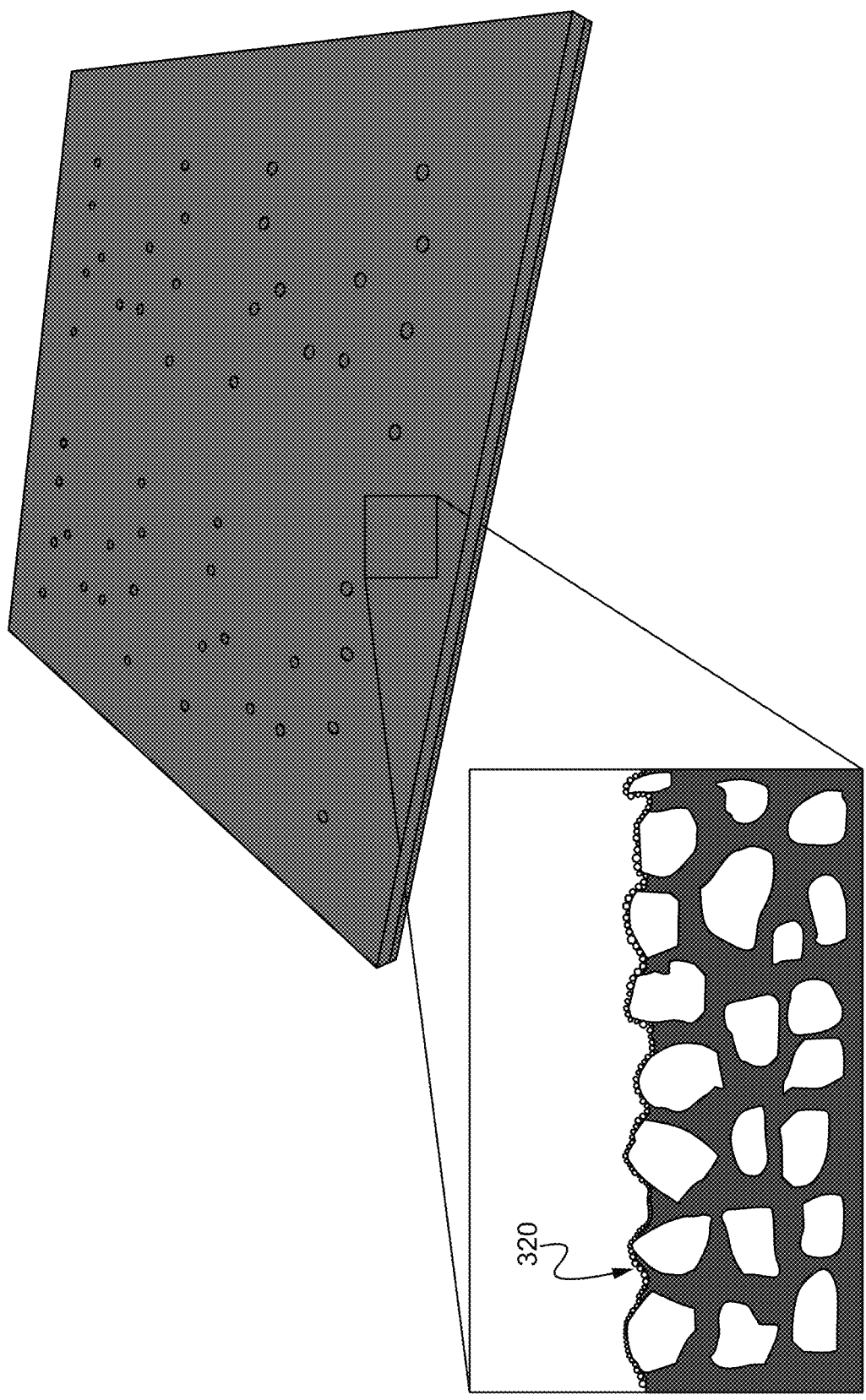
Figure 3I:
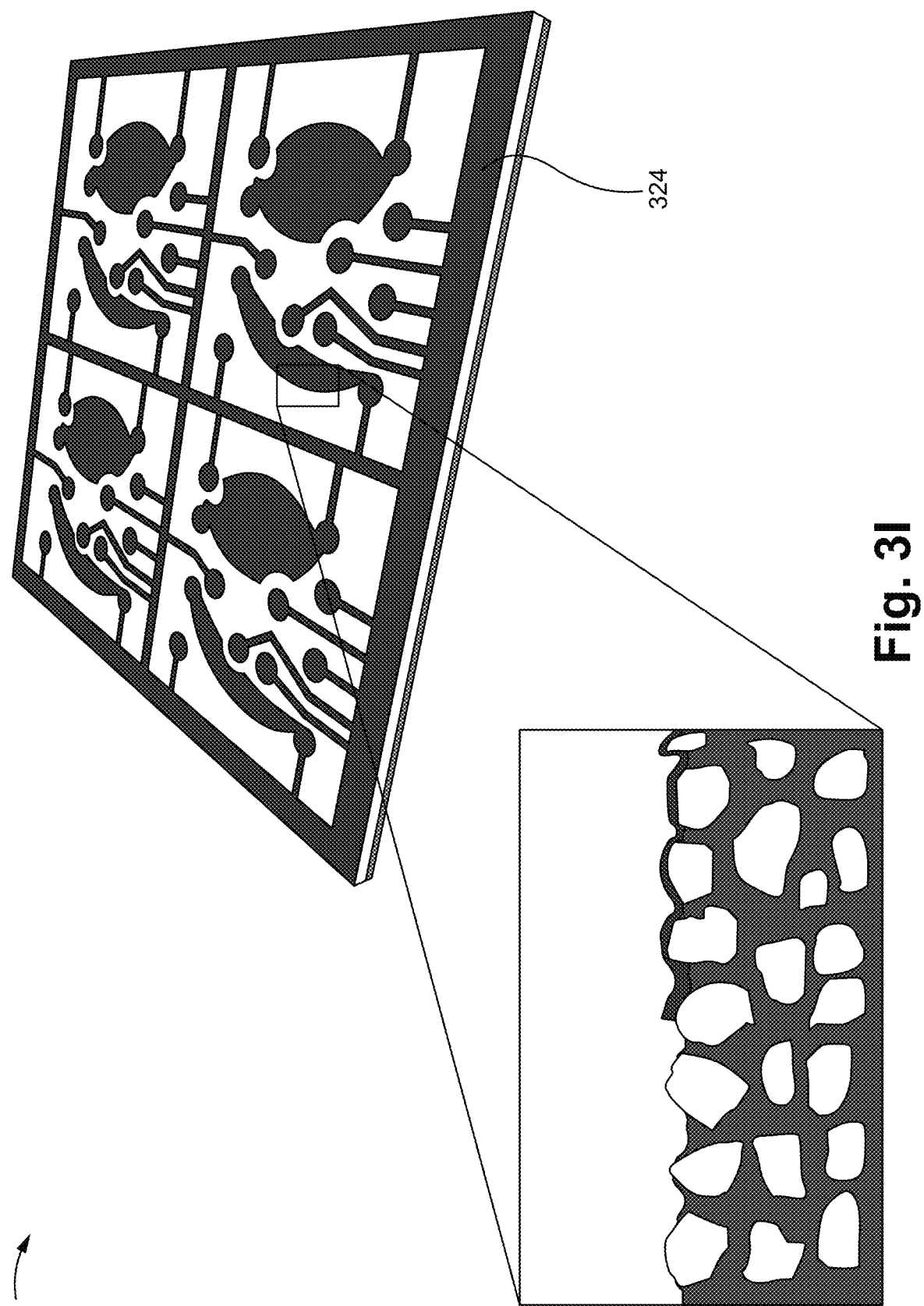
Figure 3J:
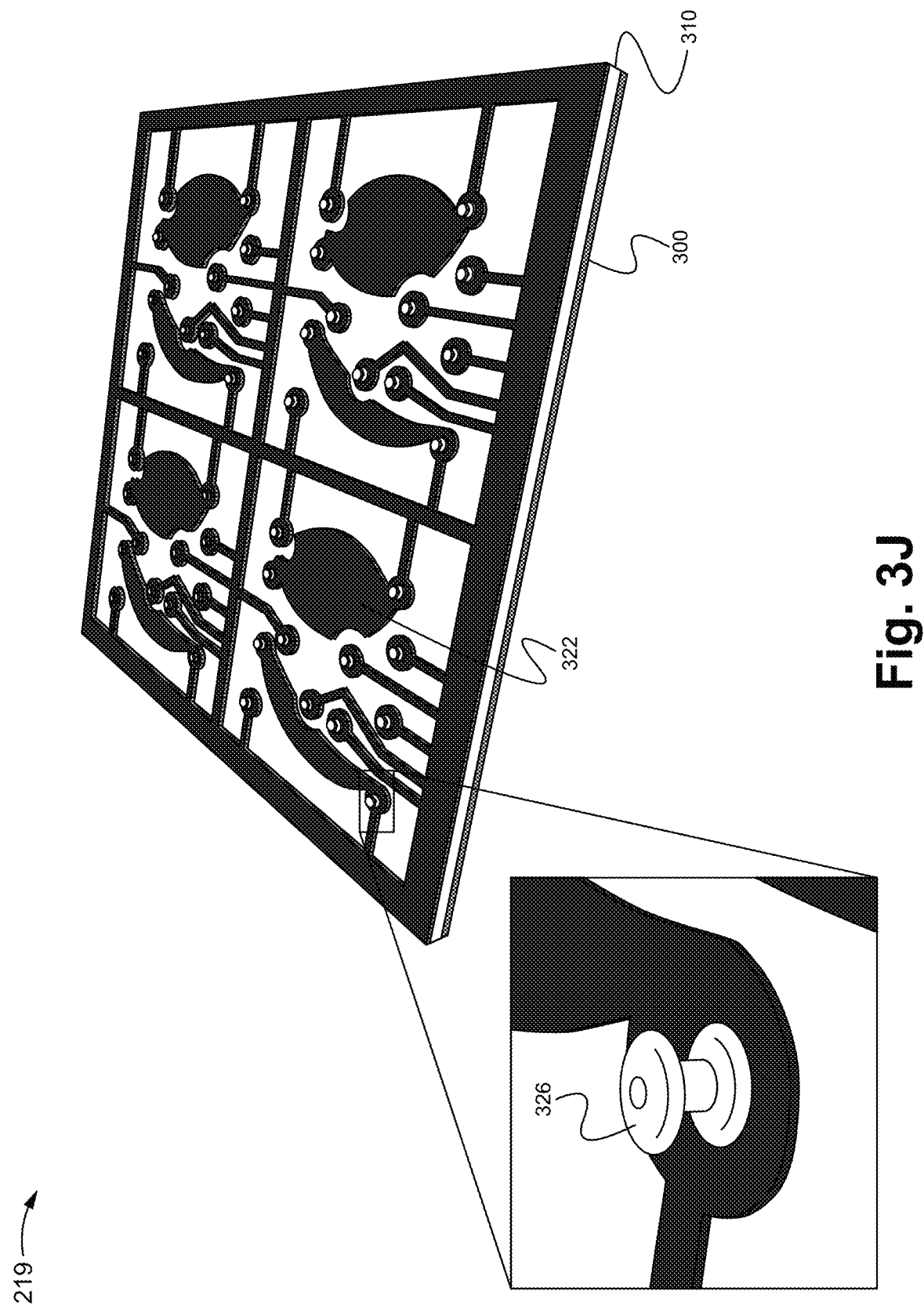
Figure 3K:
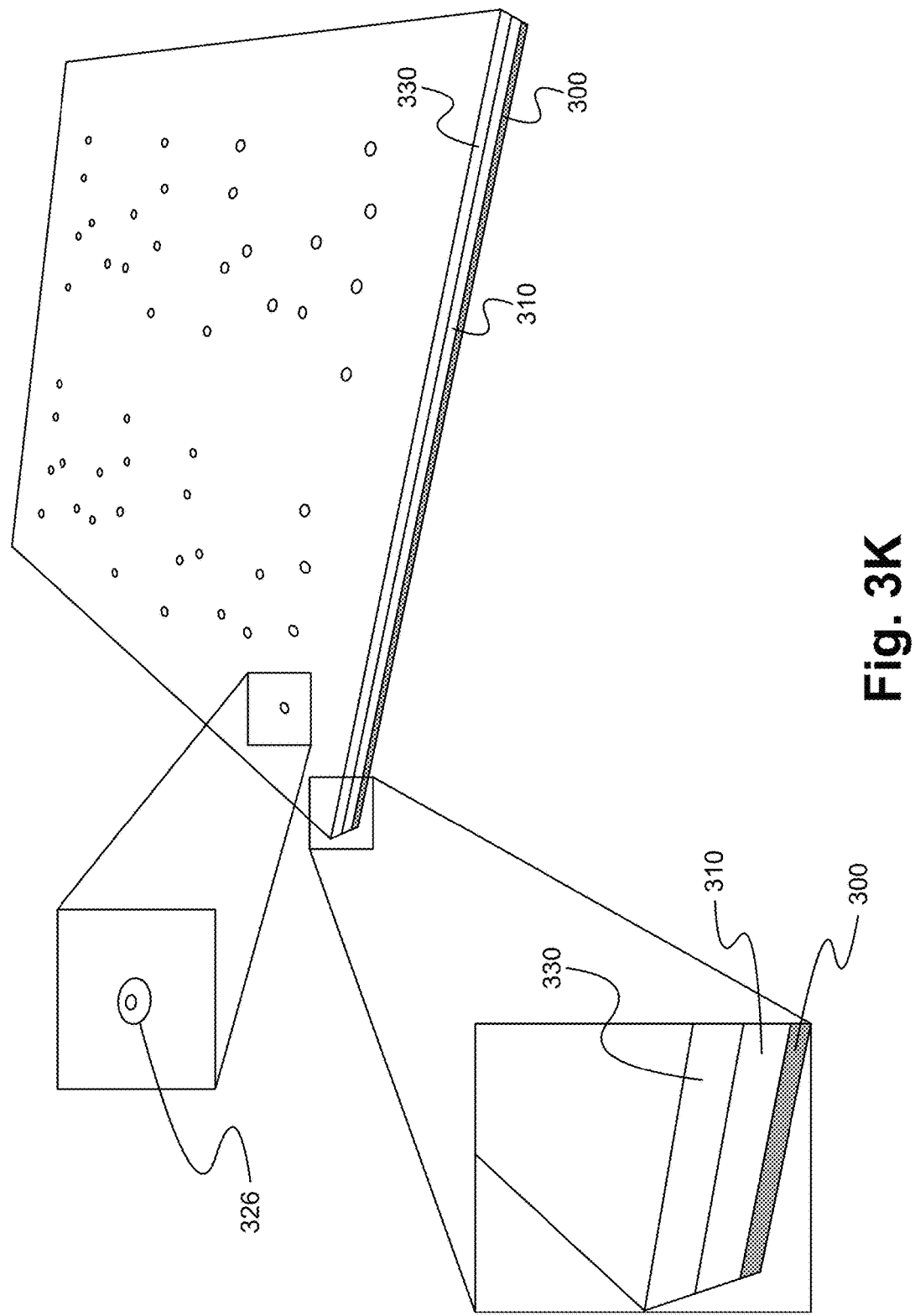
Figure 3L:
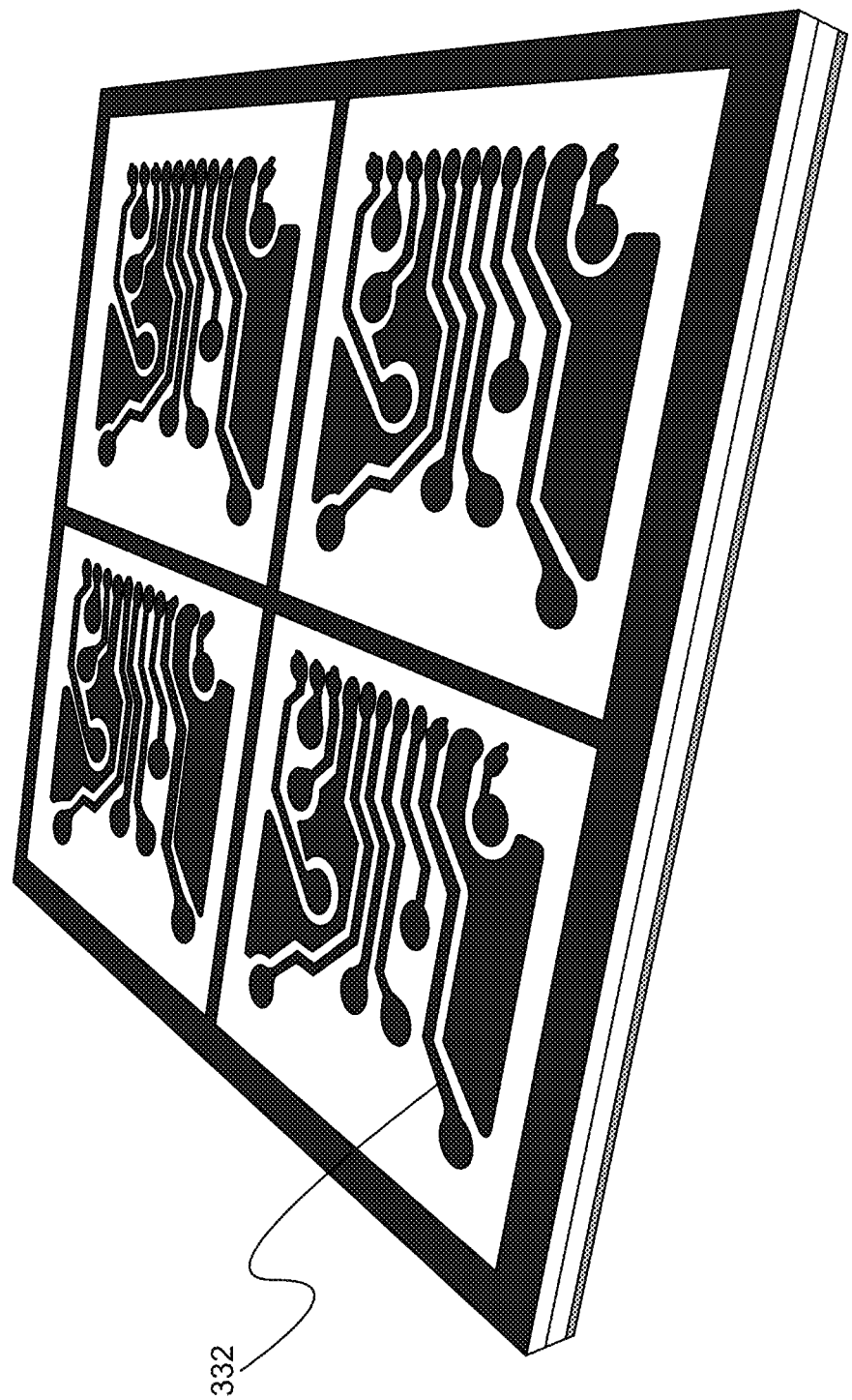
Figure 3M:
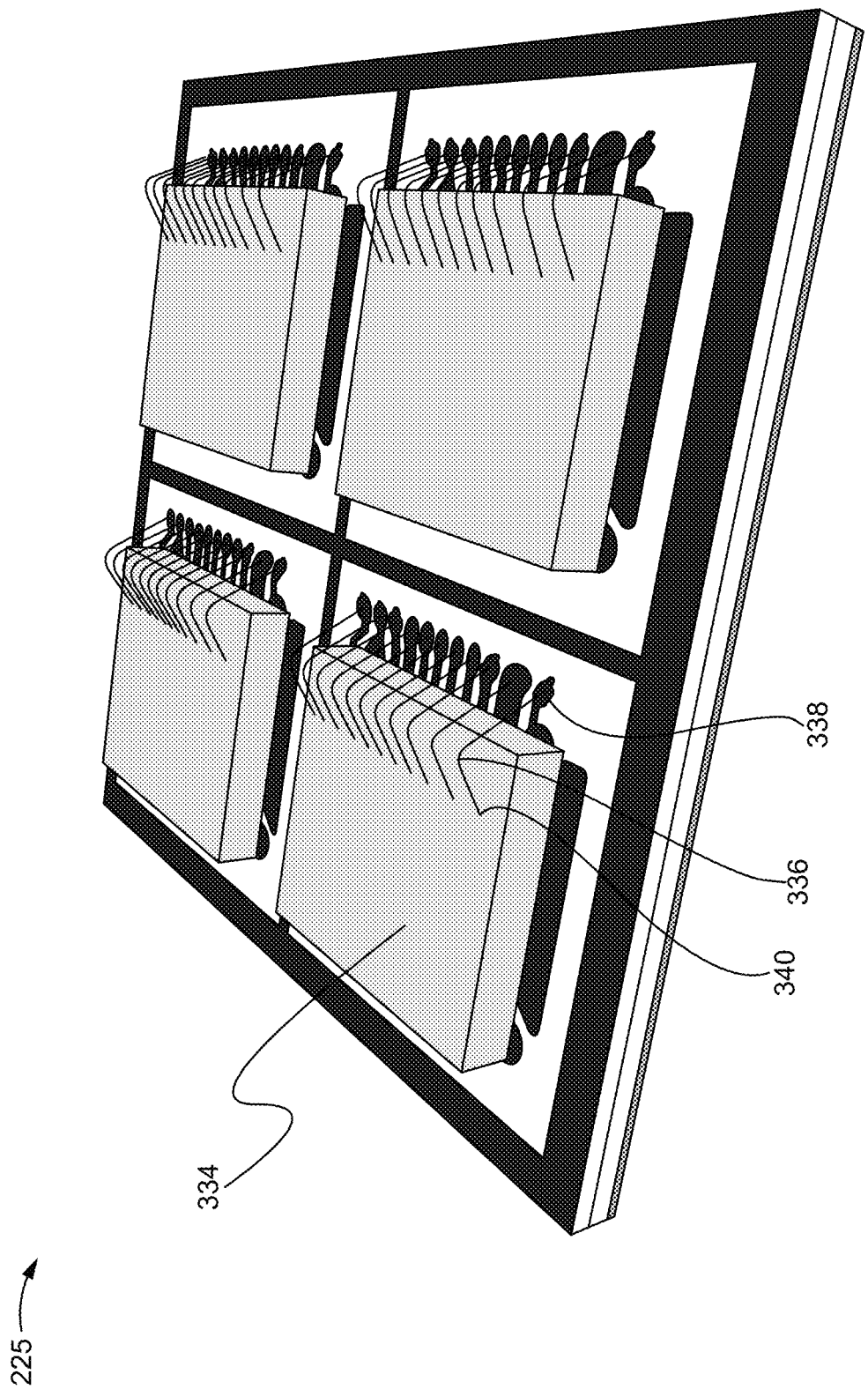
Figure 3N:
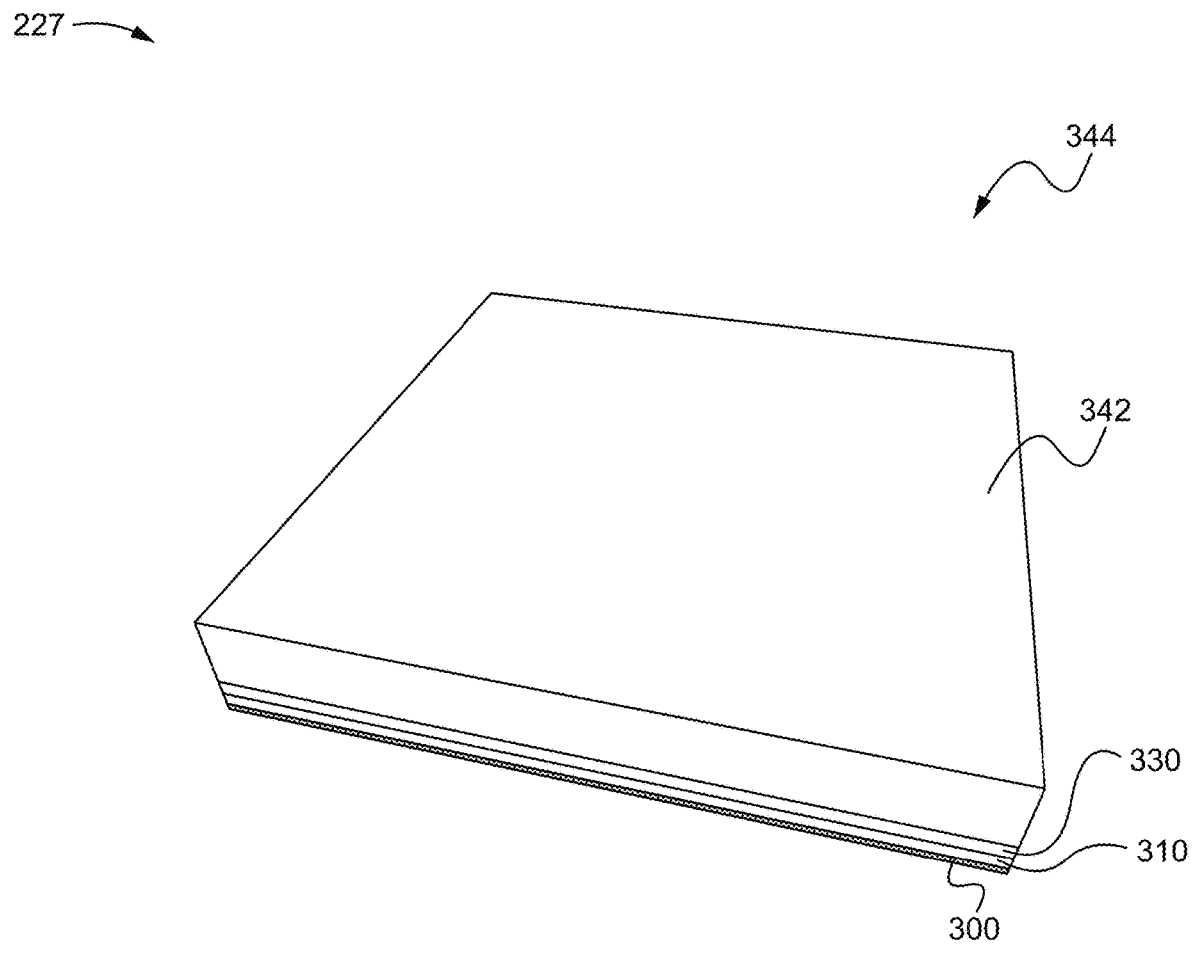
Figure 30:
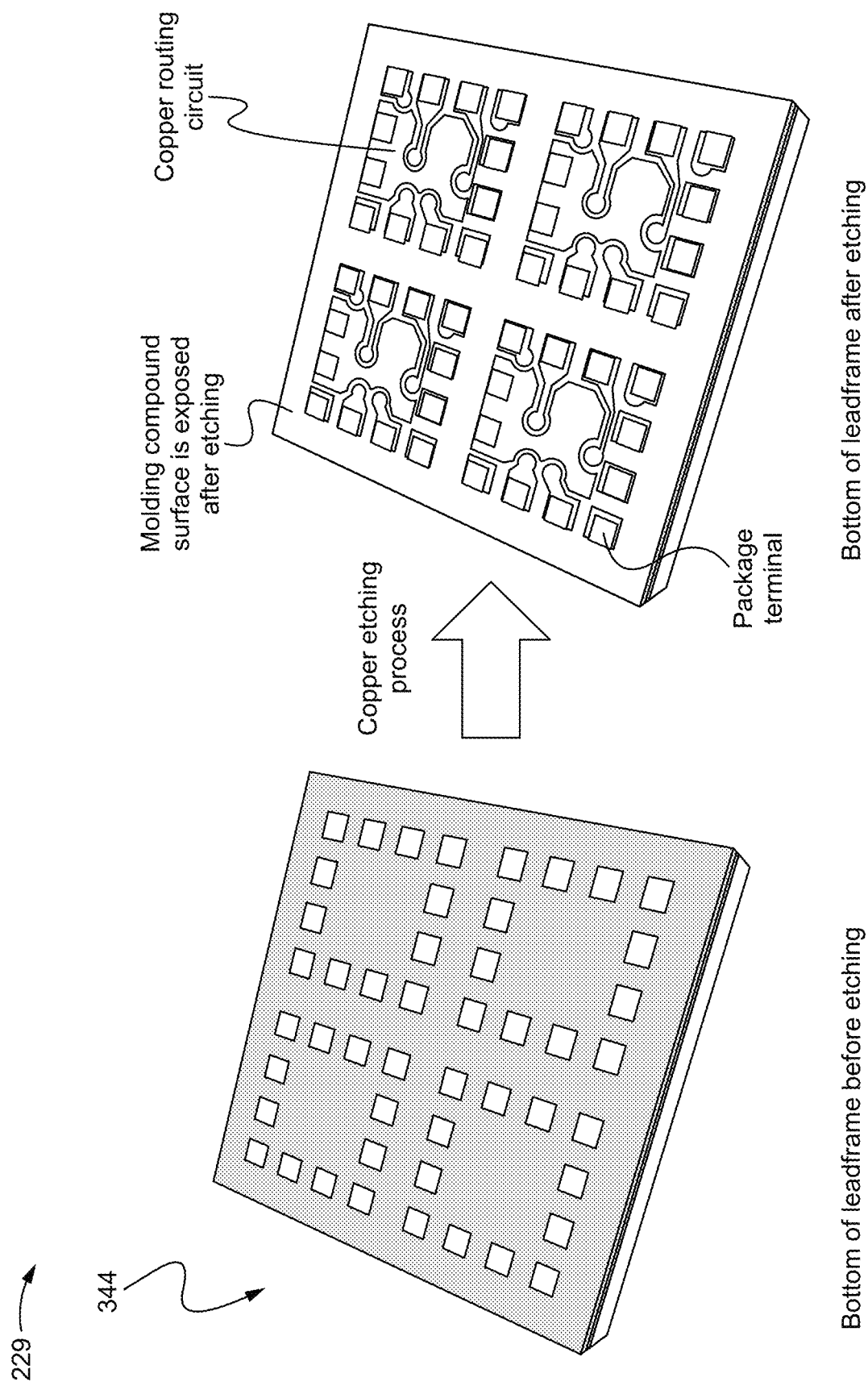
Figure 3P:
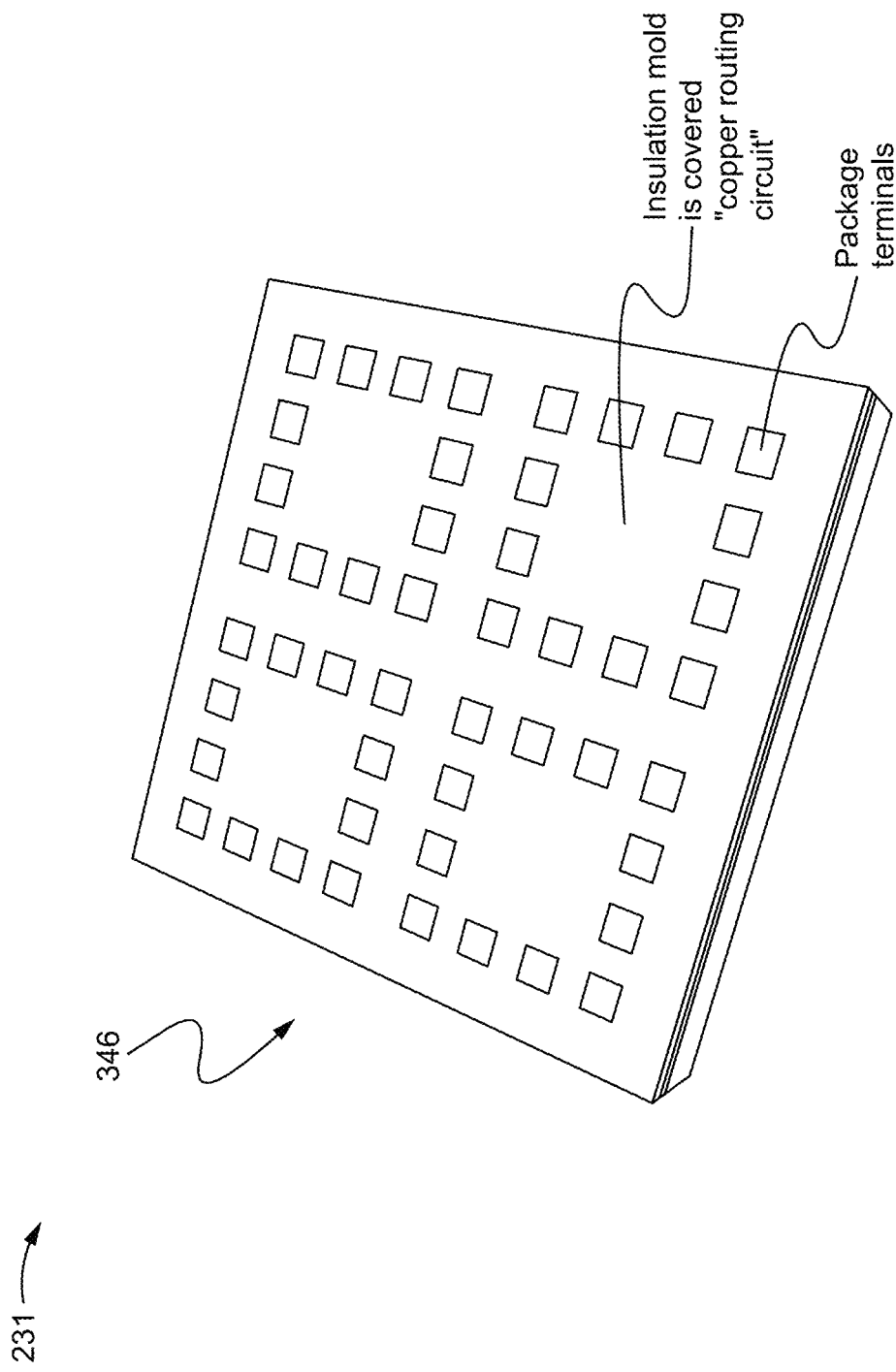
Figure 3Q:
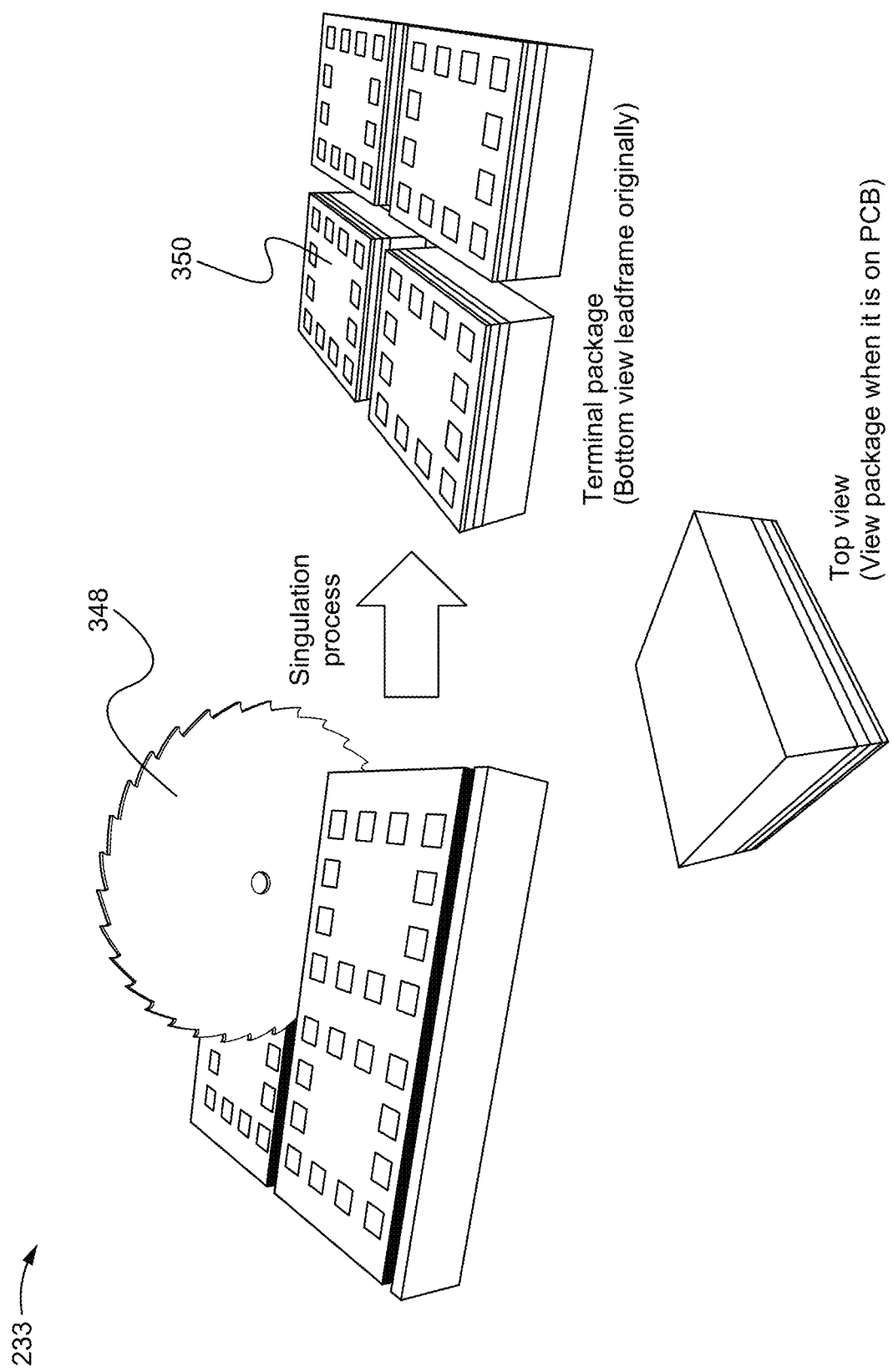

FIG. 2 illustrates an exemplary method 200 of manufacturing a semiconductor package in accordance with some embodiments. An exemplary result produced by each step of the method 200 is illustrated in FIGS. 3A-3Q. Referring to FIGS. 2 and 3A-3Q, the method 200 begins at a Step 201, where a plated leadframe 300 is obtained. In some embodiments, the leadframe 300 is made of copper. A plurality of areas 302 on the bottom side of the leadframe 300 is plated to form package terminals. A plurality of areas 306 on the top side of the leadframe 300 is also plated to form base metal routing circuits 304, which are included in the bottommost conductive routing path layer 150 in FIG. 1C. In some embodiments, the top plated areas 306 on the top side of the leadframe 300 are directly above the bottom plated areas 302 on the bottom side of the leadframe 300. In some embodiments, the plating material is Ni+Pd+Au or any other suitable material(s).

At a Step 203, a plurality of interconnections 308 is formed on top of the leadframe 300. In some embodiments, the interconnections 308 are formed on the base metal routing circuits 304 and coupled with the top plated areas 306. The material(s) of the interconnections 308 can be Cu, PdCu, AuPdCu wire, Ag wire, Ag allow wire and Au wire from a wire bond process, Ag alloy or the like, such as a soldering allow material. The process to apply this material(s) can be writing dispensing, printing (e.g., 3D inkjet printing), screen printing, electrical discharge coating, or any other suitable process.

At a Step 205, an insulation layer 310 is formed on top of the leadframe 300, resulting in a molded leadframe, to form a base of the second conductive routing path layer 160 in FIG. 1C. In some embodiments, the interconnections 308 protrude from the insulation layer 310. The material of this insulation layer 310 is a molding compound, which has a starting physical shape of a powder, pellet or sheet. The process to apply the molding compound 310 can be injection mold, transfer mold, compression mold, lamination mold, or any other suitable process. The molding material 310 includes compound fillers 310a and compound resin 310b. A magnified view is provided of the natural surface roughness 312 of a top surface of the insulation layer 310 before a surface treatment process (abrasion procedure). As discussed below, after the surface treatment process, the top surface of the insulation layer 310 has an unnatural surface roughness that is rougher than the natural surface roughness 312. The molding compound is on top of and surrounds the base metal routing circuits 304.

To prepare the molding material 310 for better adhesion with a metal layer, the top surface of the molding material 310 is roughened so that the top surface has an unnatural surface roughness that is rougher than the natural surface roughness 312. At a Step 207, a coating process is performed to coat an "adhesion promoter" material 314 on at least the top surface of the insulation layer 310. The coating process can be either a spraying or dipping process. A magnified view is provided of the layer of adhesion promoter 314 directly on top of the molding compound 310.

At a Step 209, the molded leadframe with the adhesion promoter material 314 is heated. In some embodiments, the molded leadframe with the substrate adhesion promoter material 314 is heated to 90° C. to 150° C. for approximately 10 minutes, for example, in an oven. Other temperatures and other heating durations are contemplated. The adhesion promoter material 314 is activated with the heat, thereby reacting with a portion 316 of the molding compound 310, resulting in a baked film. In particular, the adhesion promoter material 314 reacts with the molding resin 310b in the portion 316 of the molding compound 310 but not with the compound filler 310a in the portion 316 of the molding compound 318.

At a Step 211, the baked film is etched away, leaving the surface of the molding compound 310 rougher 318 than the natural surface roughness 312 of the molding compound 310 (e.g., before the surface treatment process). Put differently, after the baked film is etched away, the surface of the molding compound 310 has an unnatural surface roughness 318. In some embodiments, a wet chemical permanganic acid is used to etch out the baked film, resulting in a roughened leadframe. The roughness 318 of the surface of the molding compound 310, which is created at least by the compound fillers 310a, provides anchor points for an activator chemical in a catalysis process. Other abrasion processes are contemplated to roughen the top surface of the molding compound 1008 to obtain an unnatural surface roughness.

At a Step 213, a depositing process is performed to coat a seed layer of the activator chemical 320 on the roughened leadframe. The depositing process can be either a spraying or dipping process. In some embodiments, the activator chemical 320 includes Pd (Palladium), which reacts as a catalyst substance. In some embodiments, the activator chemical 320 includes a catalyst substance other than Pd. In some embodiments, the activator chemical 320 includes additional additives. The catalyst substance anchors on to the roughened surface 318 of the molding compound 310, resulting in an active leadframe, which has an active molding compound surface. The seed layer allows for the subsequent electroless plating to occur faster. In some embodiments, the seed layer is optional for making conductive paths 322.

At a Step 215, a removal process is performed to create a structure of conductive paths 322, which are also referred to as metal routing circuits, on the molding compound 310, resulting in a seed patterned leadframe. A laser is used to blast away un-designed or unwanted conductive areas of the seed layer such that remaining areas of the seed layer form the structure of the metal routing circuits 322. The molding compound 310 is exposed at laser blasted areas 328a. The structure of the conductive paths 322 is directly over the interconnections 308 such that the conductive paths 322 eventually formed will be in electrical communication with the interconnections 308 and with all conductive paths in previous conductive routing layers. In some embodiments, the structure also includes bus lines. Bus lines are discussed below.

At a Step 217, a plating process is performed to plate the seed patterned leadframe with a metal chemical solution 324, resulting in an electroless plated leadframe. The plating process is an electroless plating process. In some embodiments, the seed patterned leadframe is dipped in the metal chemical solution 324. An exemplary metal substance in the metal chemical solution is Cu, Ni or another suitable metal substance. The metal substance in the metal chemical solution reacts with the Pd (seed material) on the active molding compound surface but does not react with the surface of the molding compound 310 without the seed material (e.g., blasted areas 328a). The metal substance anchors on to the active molding compound surface to form the conductive paths 322. The adhesion of the metal layer 324 with the molding compound 110 having the roughened surface 318 is better than the adhesion of the metal layer 324 with one having the natural surface roughness 312 prior to the surface treatment process.

Multi-metal layers can be plated on top of each other to obtain a desired thickness of the conductive paths 322 on the molding compound 310. These metal routing circuits 322 on the molding compound 310 are included in the second conductive routing path layer 160 in FIG. 1C. One method is to perform the steps of dipping the leadframe into the activator chemical (the Step 213), laser blasting to remove seed material from non-designed conductive areas (the Step 215), and dipping the leadframe into the metal plating chemical (the Steps 217) in one or more loops until a desired thickness of the conductive paths 322 is obtained. Each new metal substance anchors to the previous anchored metal on the molding compound surface or on a previous anchored metal on metal. The thickness of each multi-metal layer depends on reaction time. In some applications that require different metal plating layer types for the conductive path pattern, different metal chemical solutions can be used for each layer. An exemplary metal plating layer type is Ni+Pd+Au.

Figure 4A:
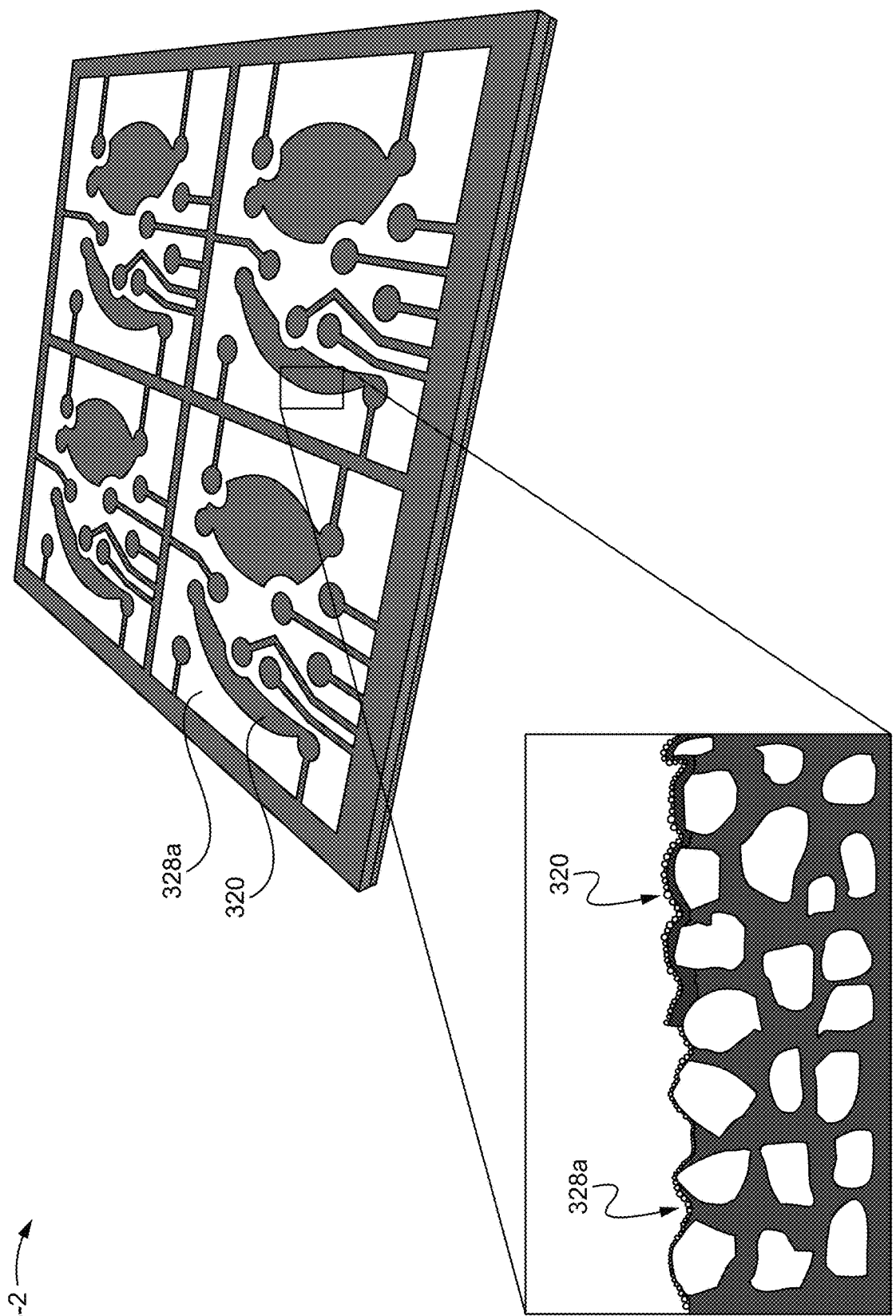
FIG. 4A-FIG. 4D illustrate exemplary views of forming multi-electroless plated layers in accordance to some embodiments.
Figure 4B:
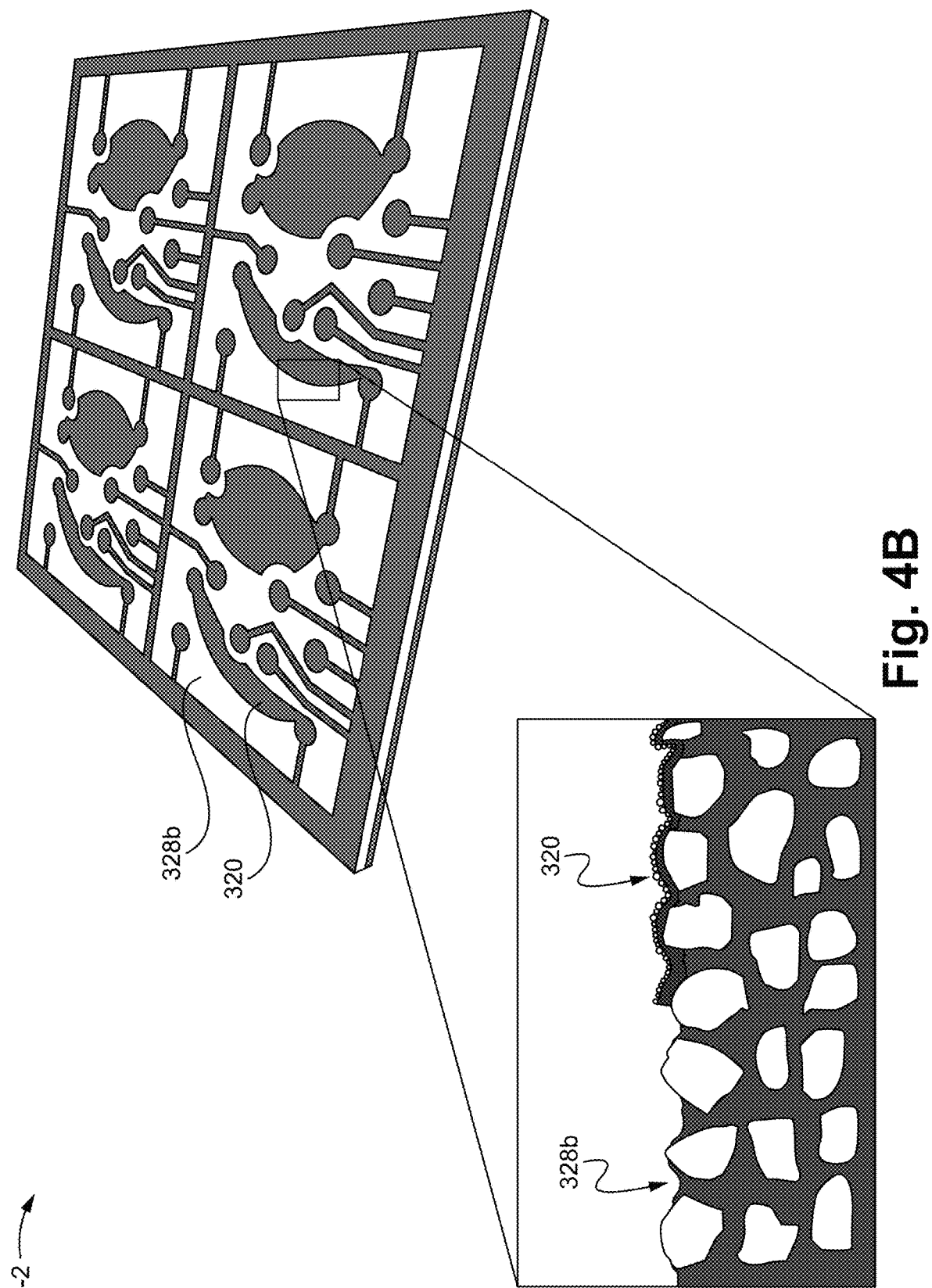
Figure 4C:
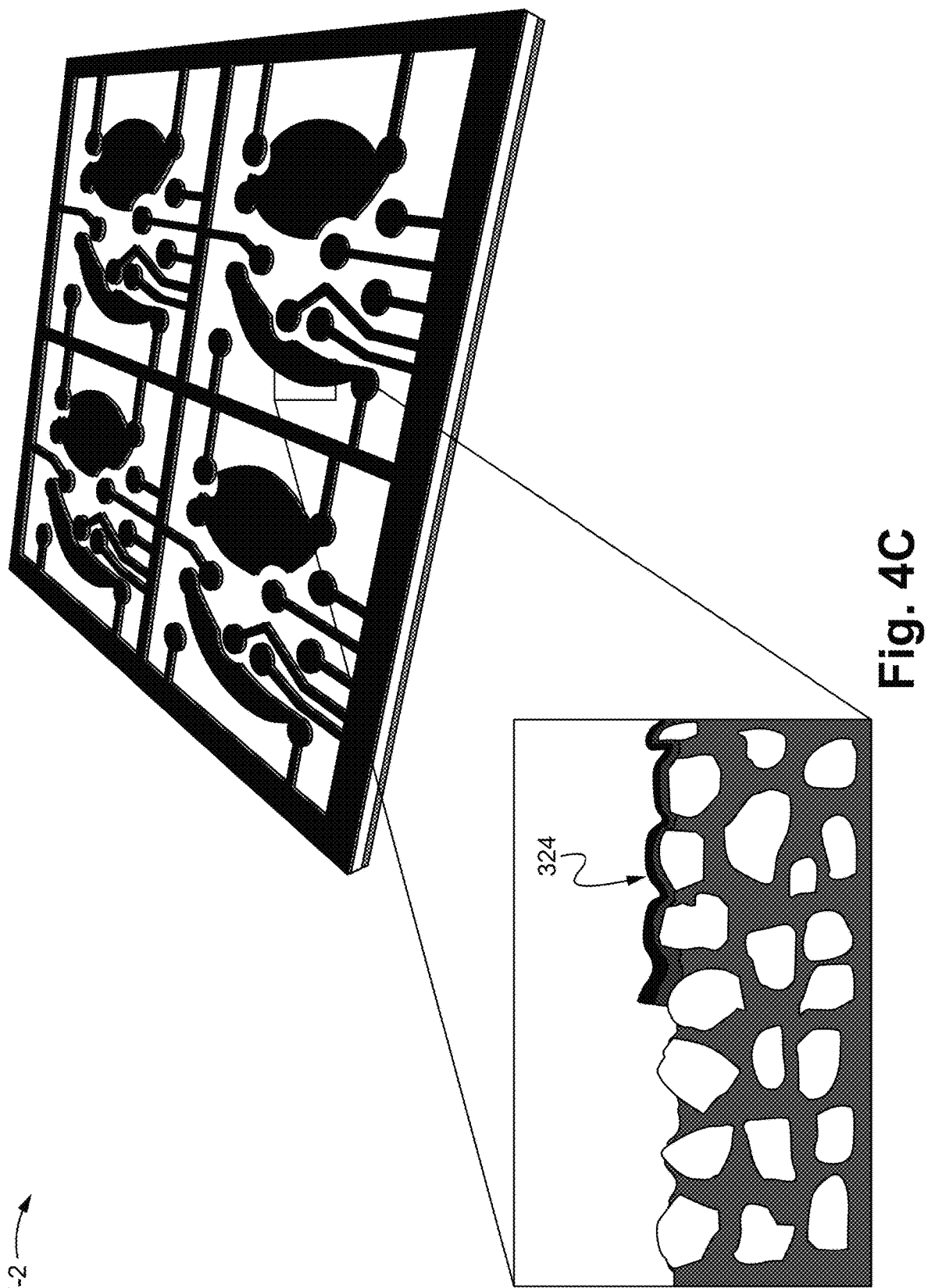
Figure 4D:
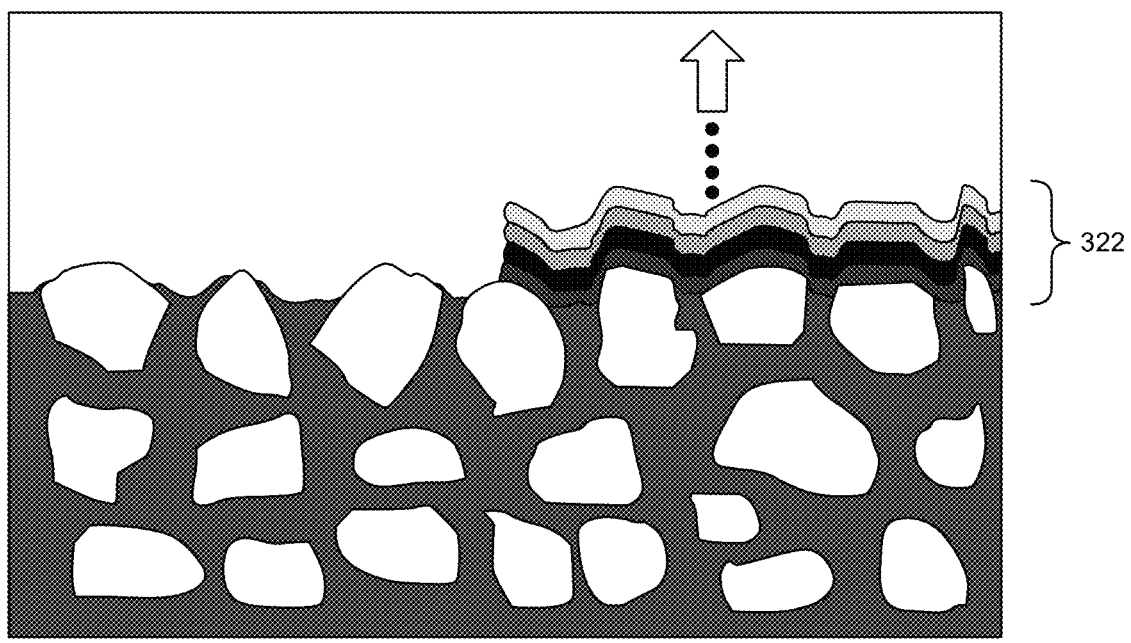

FIGS. 4A-4C illustrate an exemplary loop in accordance with some embodiments. At a Step 213-2, another coating process is performed to coat the activator chemical 320 on the previously electroless plated leadframe, such as from the Step 217. The activator chemical 320 is coated over previously blasted areas 328a and the metal routing circuit 322. The Step 213-2 helps the next electroless plating layer occur faster. At a Step 215-2, another removal process is performed to remove the seed material from unwanted surface areas such that remaining areas conform to the structure of the conductive paths 322 on the molding compound 310. The molding compound 310 is again exposed at laser blasted areas 328b, which corresponds to and directly over the previously blasted areas 328a. This removal process can be performed by using the same or similar laser blasting process as in the Step 215. At a Step 217-2, another plating process is performed to plate the substrate with the metal chemical solution 324. The metal substance reacts with the Pd on the surface of the previous metal plating (such as Cu). The final result is that the new metal substance anchors on to the surface of the previous metal plating. The new metal layer is stacked on the previous metal layer. This reaction can occur in a loop until a desired thickness of the conductive paths 322 is obtained, as illustrated in FIG. 4D. Although FIG. 4D shows the metal routing circuits 322 as having four electroless plating layers, more or less metal plating layers are contemplated.

It is possible to increase the metal plating layer thickness in a shorter amount of time than the time required by the electroless plating process. An alternative to looping or repeating the Steps 213 to 217, an electrolytic plating process can be performed after the first electroless layer is plated on the leadframe 300 (e.g., after the Step 217). FIG. 5A illustrates an exemplary electric plating machine 500.

The electroless plated leadframe from the Step 217 is held at a cathode terminal of the electric plating machine 500, while the plating material is located in a basket at an anode terminal. Both the electroless plated leadframe and the plating material are immersed in a plating solution that is in a plating tank. When an electrical power source is operating in the plating tank, an electrical current brings particles of the plating material from the anode terminal to the cathode terminal via the plating solution. Because the electroless plated leadframe is held at the cathode terminal, the plating particles which come along with the electrical current are plated on the conductive paths (metal surfaces) of the electroless plated leadframe. The thickness of the new plating material 502 plated on the conductive paths of the electroless plated leadframe via the electrolytic plating process can be obtained faster than the above-described electroless plating process.

Figure 5B:
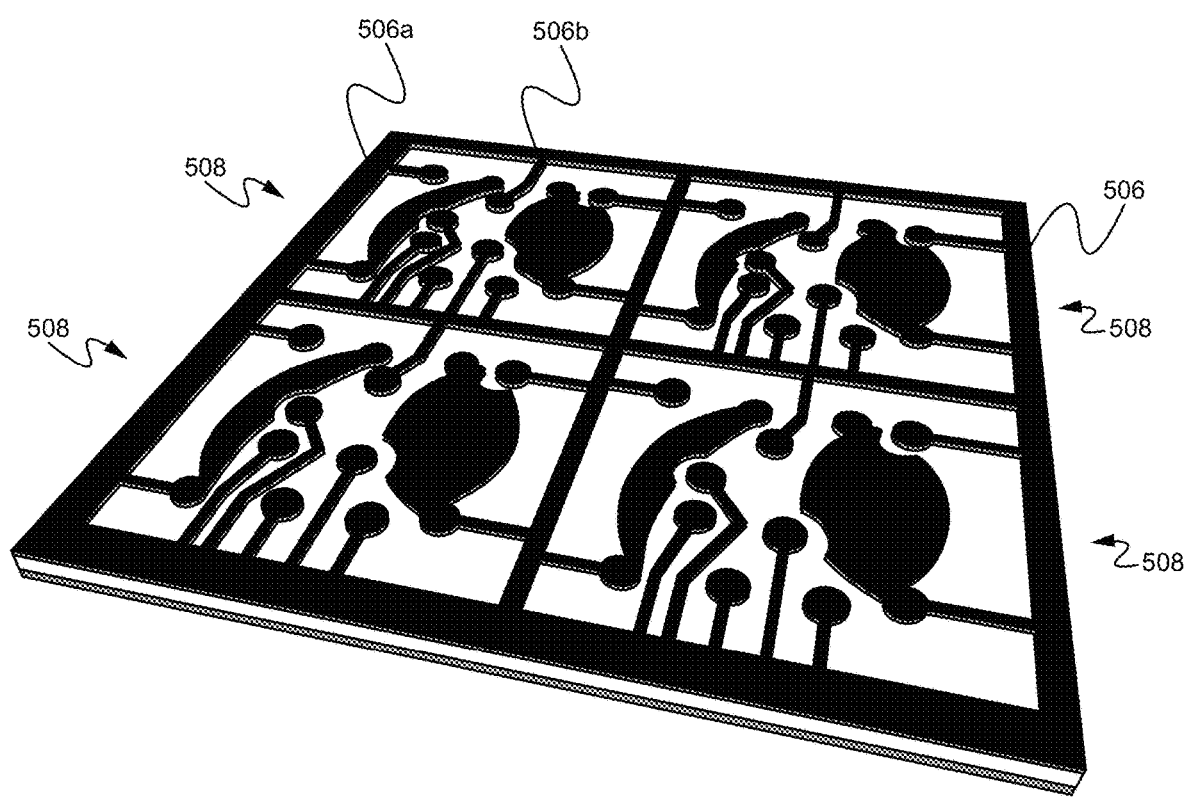

In the case of the electrolytic plating process, the molded leadframe requires conductive bus lines. The conductive bus lines are formed at the Steps 215-217. The bus lines are electrically coupled with the cathode of the electrolytic plating machine 500 such that the plating particles from the anode terminal can be deposited on the bus line and, thus, on the metal routing circuits 322. FIG. 5B illustrates an exemplary electrolytic plated leadframe 504 after the electrolytic plating process is performed on the electroless plated leadframe from the Step 217. The electrolytic plated leadframe 504 includes bus lines 506a, 506b (collectively, 506). The bus lines 506a are around the perimeter of each IC packaging section 508 of the leadframe, and are eventually removed from singulated semiconductor packages during a cut through procedure (e.g., at a Step 234). The bus lines 506b extend from bus lines 506a to the conductive paths 322 on the molding compound 310. The bus lines 506 and the conductive paths 322 are evenly plated by the electrolytic plating process.

Figure 5C:
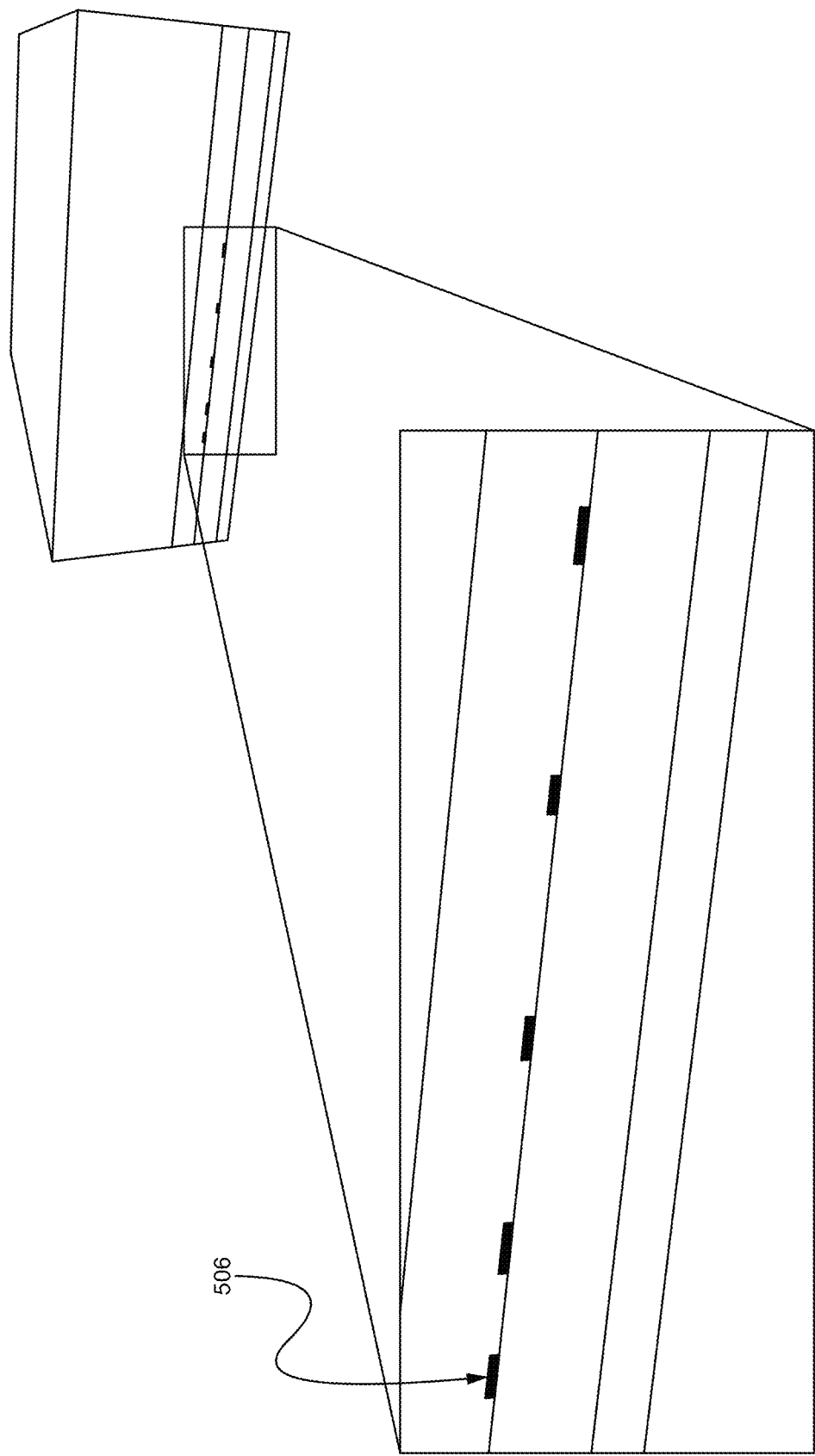

In some applications, at least a portion of the bus lines 506b are removed before completing the IC assembly process because any remaining bus lines that are exposed in a final semiconductor package can be detrimental to the final IC package when it is used in the field. Any remaining bus lines 506 that are exposed on sides of a singulated semiconductor package, illustrated in FIG. 5C, can cause issues with its environment when operating in a system, issues such as short-circuiting the system. In order to avoid short circuiting issues and other problems by the exposed bus lines 506, at least a portion of the bus lines 506b are removed before completing the IC assembly process. For example, the same or similar laser blasting process used in the Step 215 is used to trim portions 510 of the bus lines 506b that are near the package singulation paths 506a that are around the internal package perimeter of each section 508, as illustrated in FIG. 5D. As a result, when a semiconductor package is completed and singulated, there are no bus lines that are exposed at the side of the singulated semiconductor package. It is noted that, however, in some applications, exposed bus lines on the sides of a singulated semiconductor package are desirable. In such applications, the exposed bus lines are not removed.

Accordingly, after the desired metal plating layer thickness of the conductive paths 322 is obtained, either via the electrolytic plating process or electroless plating process, any portions of the bus lines can be removed as described above, if necessary or desired, prior to optionally adding one or more additional routing layers (Steps 219 to 223) and prior to completing the IC assembly process (Steps 225 to 233). It should be noted that if the electrolytic plating process is not performed, then areas of the structure associated with the unwanted portions of the bus lines 506 can be removed at the Step 215 prior to the Step 217, instead of later in the IC assembly process.

In the case additional routing path layers are required, returning to the method 200, at the Step 219, a plurality of interconnections 326 is formed on top of the leadframe 300. In some embodiments, the interconnections 326 are formed on the conductive metal routing circuits 322. The interconnections 326 are made of the same or different material as the interconnections 308. The process of applying the interconnections 326 can be the same as or different from the process of applying the interconnections 308.

At the Step 221, an insulation layer 330 is formed on top of the leadframe 300 to form a base of the next (e.g., third) conductive routing path layer 170 in FIG. 1C. In some embodiments, the interconnections 326 protrude from the insulation layer 330. The material of this insulation layer 330 can be the same as or different from the material of the insulation layer 310. The process of applying the molding compound 330 can be the same as or different from the process of applying the molding compound 310. The molding compound is on top of and surrounds the metal routing circuits 322.

At the Step 223, conductive paths 332 on the molding compound 330 are formed from one of the possible various processes described above. The conductive paths 332 can have the same or different shape as the conductive paths in any of the previous routing layers (e.g., conductive paths 322) as long as the conductive paths 332 are directly over and in electrical communication with the interconnections 326. These metal routing circuits 332 on the molding compound 330 is included in the third conductive routing path layer 170 in FIG. 1C.

In the same manner, if the semiconductor package requires additional conductive routing path layers, the Steps 219 to 223 can be repeated until a number of conductive routing path layers are obtained.

At a Step 225, a plurality of semiconductor dies 334 is coupled on the conductive paths on the topmost conductive routing path layer (e.g., the topmost conductive routing path layer 170 in FIG. 1C) using epoxy, with at least one semiconductor die 334 in each IC packaging section. In some embodiments, wire bonds 336 electrically couple the electrical pads 340 on the dies 334 and the pads 338 on the molding compound 330 that is associated with the topmost routing path layer.

At a Step 227, at least the plurality of semiconductor dies 334 and the topmost conductive routing path layer are encapsulated with a molding compound 342, resulting in a molded leadframe strip 344.

At a Step 229, a chemical etching process, such as a copper chemical etching dip process or a copper chemical etching spray process, is performed on the molded leadframe strip 344. At the bottom of the molded leadframe strip 344, the copper surface that is covered with the pre-plated metal from the Step 201 is not etched away, while the copper surface that is not covered with the pre-plated metal from the Step 201 is etched away. The chemical etching process reacts with the copper until it reaches the molding compound 310. After the copper is removed, the package terminals are isolated from each other and the base metal routing circuits 304 of the first routing path layer is revealed at the bottom of the molded leadframe strip 344.

At a Step 231, an insulation layer 346 is formed on bottom of the molded leadframe strip 344 such that the base metal routing circuits 304 is covered but the package terminals are exposed. In some embodiments, the package terminals are flush with the insulation layer 346. Alternatively, the package terminals protrude from the insulation layer 346. The insulation layer 346 protects the base metal routing circuits 304 from causing issues with its environment, such as in a printed circuit board.

At a Step 233, a cut through procedure is performed to isolate semiconductor packages 350 from the leadframe 344. A tool 348, such as a saw, is used to fully cut the leadframe along the singulation paths. Each semiconductor package 350 is similarly configured as the semiconductor package 100.

A semiconductor package, such as the singulated semiconductor package 350, includes package terminals, and a base metal plated routing layer that includes base metal routing circuits. The base metal routing circuits are formed on a first side of a copper leadframe, and the package terminals are formed on a second side of the leadframe.

The semiconductor package also includes at least one additional metal plated routing layer. Each of the at least one additional metal plated routing layer includes a plurality of interconnections coupled with routing circuits associated with a previous routing layer that is directly beneath the current metal plated routing layer, and an intermediary insulation layer formed on top of the previous routing layer. The plurality of interconnections protrudes from a top surface of the intermediary insulation layer that has an unnatural surface roughness that is rougher than the natural surface roughness of the intermediary insulation layer. Molding compound of the intermediary insulation layer surrounds the routing circuits associated with the previous routing layer. Each of the at least one additional metal plated routing layer also includes additional metal routing circuits adhered on the unnaturally roughened top surface of the intermediary insulation layer. The additional metal routing circuits includes a plurality of metal plated layers and laser blasted edges.

In some embodiments, the routing circuits associated with each routing layer is structured differently from the routing circuits associated with other routing layers. In some embodiments, the additional metal routing circuits associated with each of the at least one additional metal plated routing layer is structured differently from the additional metal routing circuits associated with other additional metal plated routing layers.

In some embodiments, each of the at least one additional metal plated routing layer further includes bus lines extending from the additional metal routing circuits. The bus lines are not exposed at sides of the semiconductor package, although the bus lines can be exposed at the sides of the semiconductor package.

The semiconductor package includes an internal routing circuit from die terminals on the die to the package terminals. The internal routing circuit is formed by all the routing layers in the semiconductor package. The semiconductor package also includes a die coupled with a topmost metal plated routing layer, a topmost insulation layer encapsulating the die and the topmost metal routing layer, and a bottommost insulation layer encapsulating the base metal routing circuits.

Figure 6A:
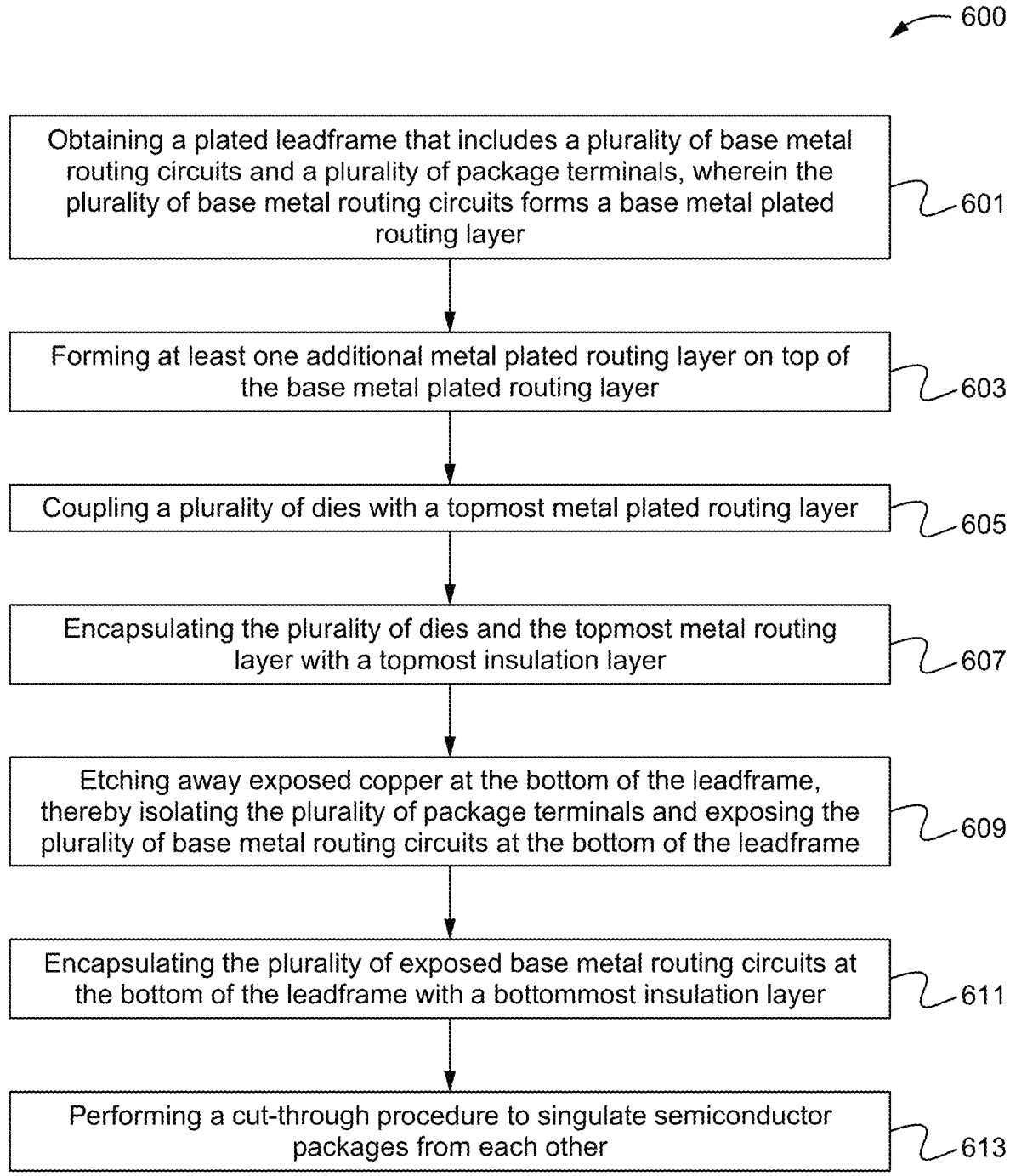
FIG. 6A-FIG. 6B illustrate an exemplary method of manufacturing semiconductor devices that each includes a plurality of conductive routing layers accordance with some embodiments.

FIG. 6A illustrates an exemplary method 600 of manufacturing semiconductor devices that each includes a plurality of conductive routing layers in accordance with some embodiments. The method 600 begins at a Step 601, where a plated leadframe is obtained. The plated leadframe includes a plurality of base metal routing circuits and a plurality of package terminals. The plurality of base metal routing circuits forms a base metal plated routing layer. In some embodiments, the plated leadframe is obtained by plating a plurality of areas on surfaces of a copper substrate, thereby resulting in the plated leadframe. The plurality of areas includes bottom plated areas that eventually form the plurality of package terminals and includes top plated areas that form the plurality of base metal routing circuits.

At a Step 603, at least one additional metal plated routing layer is formed on top of the base metal plated routing layer. Each of the at least one additional metal plated routing layer is formed by the method 650 illustrated in FIG. 6B.

Figure 6B:
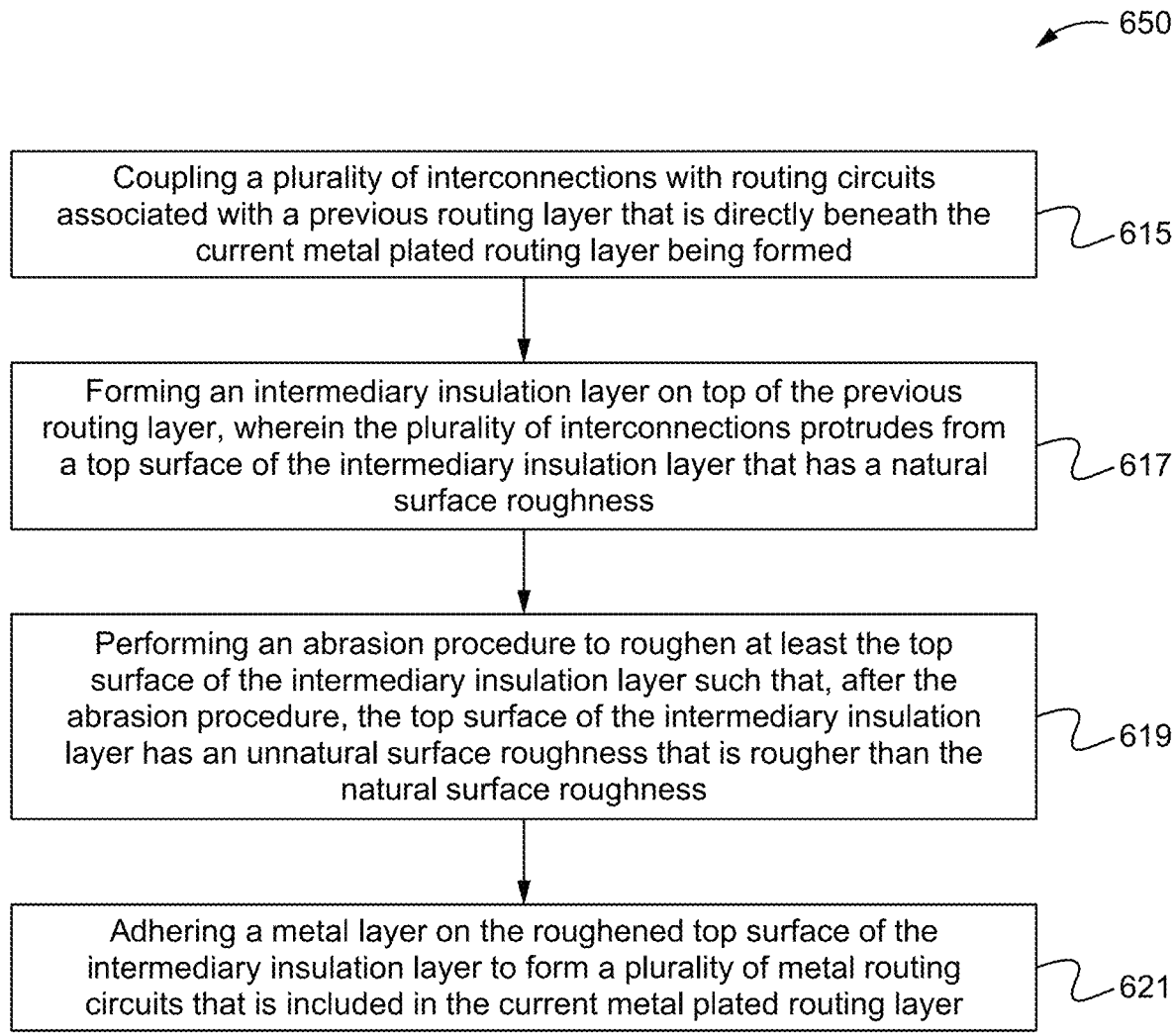

Referring to FIG. 6B, at a Step 615, a plurality of interconnections is coupled with routing circuits associated with a previous routing layer that is directly beneath the current metal plated routing layer being formed.

At a Step 617, an intermediary insulation layer is formed on top of the previous routing layer. The plurality of interconnections protrudes from a top surface of the intermediary insulation layer that has a natural surface roughness.

At a Step 619, an abrasion procedure is performed to roughen at least the top surface of the intermediary insulation layer such that, after the abrasion procedure, the top surface of the intermediary insulation layer has an unnatural surface roughness that is rougher than the natural surface roughness.

In some embodiments, the abrasion procedure includes coating at least the top surface of the intermediary insulation layer with an adhesion promoter material, heating the leadframe such that the adhesion promoter material reacts with a portion of the intermediary insulation layer, and etching away a baked film, resulting in the top surface of the intermediary insulation layer having the unnatural surface roughness that is rougher than the natural surface roughness.

In some embodiments, a catalyst material is deposited on the roughened top surface of the intermediary insulation layer, and unwanted areas of the catalyst material are removed such that the remaining areas of the catalyst material form a structure of the plurality of additional metal routing circuits.

At a Step 621, a metal layer is adhered on the roughened top surface of the intermediary insulation layer to form a plurality of additional metal routing circuits that is included in the current metal plated routing layer. The metal layer can be adhered on the roughened top surface includes using a metal chemical solution. In some embodiments, metal substance in the metal chemical solution reacts with the remaining areas of the catalyst material such that the adhesion of the metal layer with the intermediary insulation layer having the unnatural surface roughness is better than the adhesion of the metal layer with the intermediary insulation layer having the natural surface roughness.

In some embodiments, a desired thickness of the additional metal routing circuits is obtained whereby metal is plated on metal. The desired thickness of the additional metal routing circuits is obtained via an electroless plating process, wherein the electroless plating process includes repeating the depositing step, the removing step and the adhering step in one or more loops. Alternatively, the desired thickness of the additional metal routing circuits is obtained via an electrolytic plating process. In some embodiments, after the desired thickness of the additional metal routing circuits is obtained, at least a portion of bus lines is removed.

Returning to FIG. 6A, at a Step 605, a plurality of dies is coupled with a topmost metal plated routing layer.

At a Step 607, the plurality of dies and the topmost metal routing layer are encapsulated with a topmost insulation layer.

At a Step 609, exposed copper at the bottom of the leadframe is etched away, thereby isolating the plurality of package terminals and exposing the plurality of base metal routing circuits at the bottom of the leadframe.

At a Step 611, the plurality of exposed base metal routing circuits at the bottom of the leadframe is encapsulated with a bottommost insulation layer.

At a Step 613, a cut-through procedure is performed to singulate the semiconductor packages from each other.

It is noted that the demonstration discussed herein is on a semiconductor package with three conductive routing path layers. However, by the concept of this invention, it is possible to create more conductive routing layers to stack on each other such that a final semiconductor package can have more than three conductive routing path layers.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A method of manufacturing semiconductor devices that each includes a plurality of conductive routing layers, comprising:
    obtaining a plated leadframe that includes a plurality of base metal routing circuits and a plurality of package terminals, wherein the plurality of base metal routing circuits forms a base metal plated routing layer;
    forming at least one additional metal plated routing layer on top of the base metal plated routing layer, wherein each of the at least one additional metal plated routing layer is formed by:
        coupling a plurality of interconnections with routing circuits associated with a previous routing layer that is directly beneath a current metal plated routing layer being formed;
        forming an intermediary insulation layer on top of the previous routing layer, wherein the plurality of interconnections protrudes from a top surface of the intermediary insulation layer that has a natural surface roughness;
        performing an abrasion procedure to roughen at least the top surface of the intermediary insulation layer such that, after the abrasion procedure, the top surface of the intermediary insulation layer has an unnatural surface roughness that is rougher than the natural surface roughness; and
        adhering a metal layer on the roughened top surface of the intermediary insulation layer to form a plurality of additional metal routing circuits that is included in the current metal plated routing layer;
    coupling a plurality of dies with a topmost metal plated routing layer;
    encapsulating the plurality of dies and the topmost metal routing layer with a topmost insulation layer;
    etching away exposed copper at the bottom of the leadframe, thereby isolating the plurality of package terminals and exposing the plurality of base metal routing circuits at the bottom of the leadframe;
    encapsulating the plurality of exposed base metal routing circuits at the bottom of the leadframe with a bottommost insulation layer; and performing a cut-through procedure to singulate the semiconductor packages from each other.

2. The method of claim 1, wherein obtaining a plated leadframe includes:
   plating a plurality of areas on surfaces of a copper substrate, thereby resulting in the plated leadframe, wherein the plurality of areas includes bottom plated areas that eventually form the plurality of package terminals and includes top plated areas that form the plurality of base metal routing circuits.

3. The method of claim 2, wherein the abrasion procedure includes:
   coating at least the top surface of the intermediary insulation layer with an adhesion promoter material;
   heating the leadframe such that the adhesion promoter material reacts with a portion of the intermediary insulation layer; and
   etching away a baked film, resulting in the top surface of the intermediary insulation layer having the unnatural surface roughness that is rougher than the natural surface roughness.

4. The method of claim 3, wherein each of the at least one additional metal plated routing layer is further formed by, after performing an abrasion procedure and before adhering a metal layer on the roughened top surface:
   depositing a catalyst material on the roughened top surface of the intermediary insulation layer; and
   removing unwanted areas of the catalyst material such that the remaining areas of the catalyst material form a structure of the plurality of additional metal routing circuits.

5. The method of claim 4, wherein adhering a metal layer on the roughened top surface includes using a metal chemical solution, wherein metal substance in the metal chemical solution reacts with the remaining areas of the catalyst material such that the adhesion of the metal layer with the intermediary insulation layer having the unnatural surface roughness is better than the adhesion of the metal layer with the intermediary insulation layer having the natural surface roughness.

6. The method of claim 5, wherein each of the at least one additional metal plated routing layer is further formed by, after adhering a metal layer on the roughened top surface, obtaining a desired thickness of the additional metal routing circuits whereby metal is plated on metal.

7. The method of claim 6, wherein the desired thickness of the additional metal routing circuits is obtained via an electroless plating process, wherein the electroless plating process includes repeating the depositing step, the removing step and the adhering step in one or more loops.

8. The method of claim 6, wherein the desired thickness of the additional metal routing circuits is obtained via an electrolytic plating process.

9. The method of claim 6, wherein each of the at least one additional metal plated routing layer is further formed by, after obtaining a desired thickness of the additional metal routing circuits, removing at least a portion of bus lines.

10. A method of manufacturing semiconductor devices that each includes a plurality of conductive routing layers, comprising:
   obtaining a plated leadframe that includes a plurality of base metal routing circuits and a plurality of package terminals, wherein the plurality of base metal routing circuits forms a base metal plated routing layer;
   forming at least one additional metal plated routing layer on top of the base metal plated routing layer, wherein each of the at least one additional metal plated routing layer is formed by:
      coupling a plurality of interconnections with routing circuits associated with a previous routing layer that is directly beneath a current metal plated routing layer being formed;
      forming an intermediary insulation layer on top of the previous routing layer, wherein the plurality of interconnections protrudes from a top surface of the intermediary insulation layer that has a natural surface roughness;
      performing an abrasion procedure to roughen at least the top surface of the intermediary insulation layer such that, after the abrasion procedure, the top surface of the intermediary insulation layer has an unnatural surface roughness that is rougher than the natural surface roughness;
      adhering a metal layer on the roughened top surface of the intermediary insulation layer to form a plurality of additional metal routing circuits that is included in the current metal plated routing layer; and
      removing portions of bus lines extending from the plurality of additional metal routing circuits such that the bus lines are not exposed at sides of the semiconductor packages after singulation, wherein the portions are near package singulation paths;
   coupling a plurality of dies with a topmost metal plated routing layer;
   encapsulating the plurality of dies and the topmost metal routing layer with a topmost insulation layer;
   etching away exposed copper at the bottom of the leadframe, thereby isolating the plurality of package terminals and exposing the plurality of base metal routing circuits at the bottom of the leadframe;
   encapsulating the plurality of exposed base metal routing circuits at the bottom of the leadframe with a bottommost insulation layer; and
   performing a cut-through procedure to singulate the semiconductor packages from each other.

11. The method of claim 10, wherein the unnatural surface roughness is formed by compound fillers in the intermediary insulation layer protruding beyond compound resin in the intermediary insulation layer.

12. The method of claim 10, wherein the abrasion procedure includes:
   coating at least the top surface of the intermediary insulation layer with an adhesion promoter material;
   heating the leadframe such that the adhesion promoter material reacts with a portion of the intermediary insulation layer; and
   etching away a baked film, resulting in the top surface of the intermediary insulation layer having the unnatural surface roughness that is rougher than the natural surface roughness.

13. The method of claim 10, wherein each of the at least one additional metal plated routing layer is further formed by, after performing an abrasion procedure and before adhering a metal layer on the roughened top surface:
   depositing a catalyst material on the roughened top surface of the intermediary insulation layer; and
   removing unwanted areas of the catalyst material such that the remaining areas of the catalyst material form a structure of the plurality of additional metal routing circuits.

14. The method of claim 13, wherein adhering a metal layer on the roughened top surface includes using a metal chemical solution, wherein metal substance in the metal chemical solution reacts with the remaining areas of the catalyst material such that the adhesion of the metal layer with the intermediary insulation layer having the unnatural surface roughness is better than the adhesion of the metal layer with the intermediary insulation layer having the natural surface roughness.

15. The method of claim 10, wherein each of the at least one additional metal plated routing layer is further formed by, after adhering a metal layer on the roughened top surface, obtaining a desired thickness of the additional metal routing circuits whereby metal is plated on metal.

16. The method of claim 10, wherein exposed surfaces of the package terminals are flush with a bottom surface of the bottommost insulation layer.

17. The method of claim 10, wherein the package terminals are in electrical communication with the base metal routing circuits via a copper leadframe.

\* \* \* \* \*